(12) United States Patent
Onozawa

(10) Patent No.: US 9,673,309 B2
(45) Date of Patent: Jun. 6, 2017

(54) SEMICONDUCTOR DEVICE AND METHOD FOR FABRICATING SEMICONDUCTOR DEVICE

(71) Applicant: FUJI ELECTRIC CO., LTD., Kawasaki-shi (JP)

(72) Inventor: Yuichi Onozawa, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/841,592

(22) Filed: Aug. 31, 2015

(65) Prior Publication Data
US 2016/0027906 A1    Jan. 28, 2016

Related U.S. Application Data

(63) Continuation of application No. PCT/JP2014/060264, filed on Apr. 9, 2014.

(30) Foreign Application Priority Data

Apr. 11, 2013   (JP) .................................. 2013-083396

(51) Int. Cl.
*H01L 29/739* (2006.01)
*H01L 29/66* (2006.01)
(Continued)

(52) U.S. Cl.
CPC ...... *H01L 29/7397* (2013.01); *H01L 29/0611* (2013.01); *H01L 29/0619* (2013.01);
(Continued)

(58) Field of Classification Search
CPC ........... H01L 29/66348; H01L 29/7397; H01L 29/0696; H01L 29/41708; H01L 29/0804; H01L 29/407; H01L 29/0611
See application file for complete search history.

(56) References Cited

U.S. PATENT DOCUMENTS 5,329,142 A    7/1994   Kitagawa et al.
6,815,769 B2   11/2004  Pfirsch et al.
(Continued)

FOREIGN PATENT DOCUMENTS

CN    104221153 A    12/2014
EP      2822039 A1    1/2015
(Continued)

OTHER PUBLICATIONS

Yamaguchi, M. et al., "IEGT design criterion for reducing EMI noise", Proceedings of 2004 International Symposium on Power Semiconductor Devices and ICs, Kitakyushu, (ISPSD '04), May 24-27, 2004, pp. 115-118.

*Primary Examiner* — Walter H Swanson
(74) *Attorney, Agent, or Firm* — Rabin & Berdo, P.C.

(57) ABSTRACT

A p-layer on a surface layer of one of n⁻ drift layers is separated into a p-base-region and a floating p-region by a plurality of trenches. A first gate electrode is disposed on a side wall of the trench on the p-base-region side via a first insulation film, and a shield electrode is disposed on a side wall of the trench on the floating p-region side via a second insulation film. Between the first gate electrode conductively connected to a gate runner via a contact plug embedded in a first contact hole and the shield electrode conductively connected to an emitter electrode via a contact plug embedded in a second contact hole, an insulation film reaches from the front surface of the substrate to the bottom surface of the trench. Hence, the fabrication process can be shortened to provide a highly reliable semiconductor device with low switching loss.

8 Claims, 20 Drawing Sheets

(51) Int. Cl.
*H01L 29/06* (2006.01)
*H01L 29/08* (2006.01)
*H01L 29/40* (2006.01)
*H01L 29/417* (2006.01)

(52) U.S. Cl.
CPC ...... *H01L 29/0696* (2013.01); *H01L 29/0804* (2013.01); *H01L 29/407* (2013.01); *H01L 29/41708* (2013.01); *H01L 29/66348* (2013.01)

(56) References Cited

U.S. PATENT DOCUMENTS

| | | |
|---|---|---|
| 9,054,154 B2 | 6/2015 | Onozawa et al. |
| 2001/0054738 A1 | 12/2001 | Momota et al. |
| 2003/0160270 A1 | 8/2003 | Pfirsch et al. |
| 2006/0049456 A1 | 3/2006 | Sugiyama |
| 2007/0210350 A1 | 9/2007 | Omura et al. |
| 2008/0079081 A1 | 4/2008 | Hashimoto |
| 2008/0185638 A1 | 8/2008 | Yamaoka et al. |
| 2009/0189181 A1 | 7/2009 | Koyama et al. |
| 2010/0019314 A1 | 1/2010 | Kachi |
| 2011/0133718 A1 | 6/2011 | Watanabe et al. |
| 2012/0061723 A1 | 3/2012 | Ishii |
| 2012/0104555 A1* | 5/2012 | Bobde ................ H01L 29/0696 257/587 |
| 2013/0175574 A1* | 7/2013 | Matsuura .......... H01L 29/66348 257/139 |

FOREIGN PATENT DOCUMENTS

| | | |
|---|---|---|
| JP | H05-243561 A | 9/1993 |
| JP | 2001-308327 A | 11/2001 |
| JP | 2004-207706 A | 7/2004 |
| JP | 2006-080110 A | 3/2006 |
| JP | 2008-085278 A | 4/2008 |
| JP | 2008-166434 A | 7/2008 |
| JP | 2009-054903 A | 3/2009 |
| JP | 2010-028029 A | 2/2010 |
| JP | 2011-014621 A | 1/2011 |
| JP | 2012-064641 A | 3/2012 |

* cited by examiner

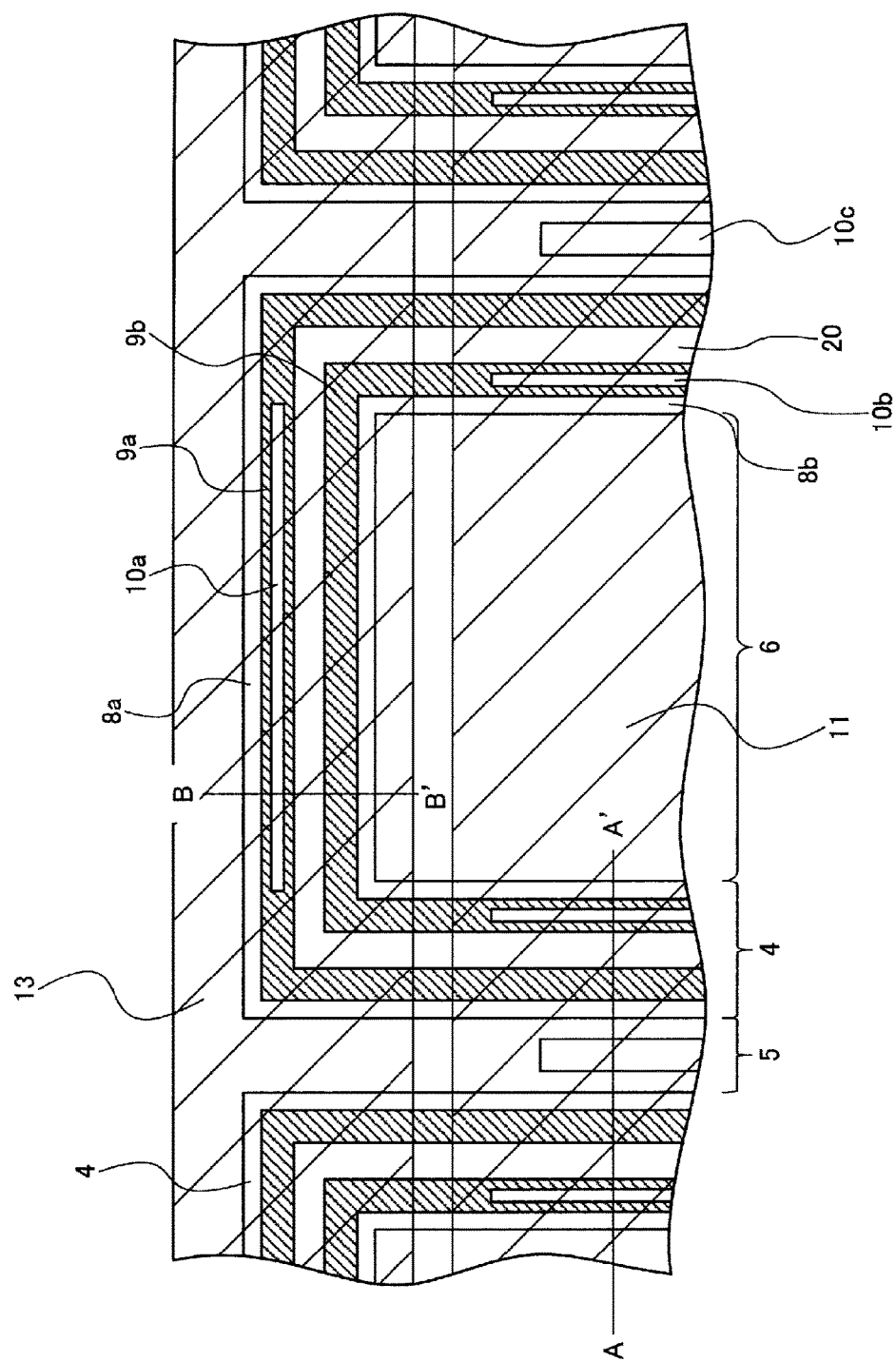

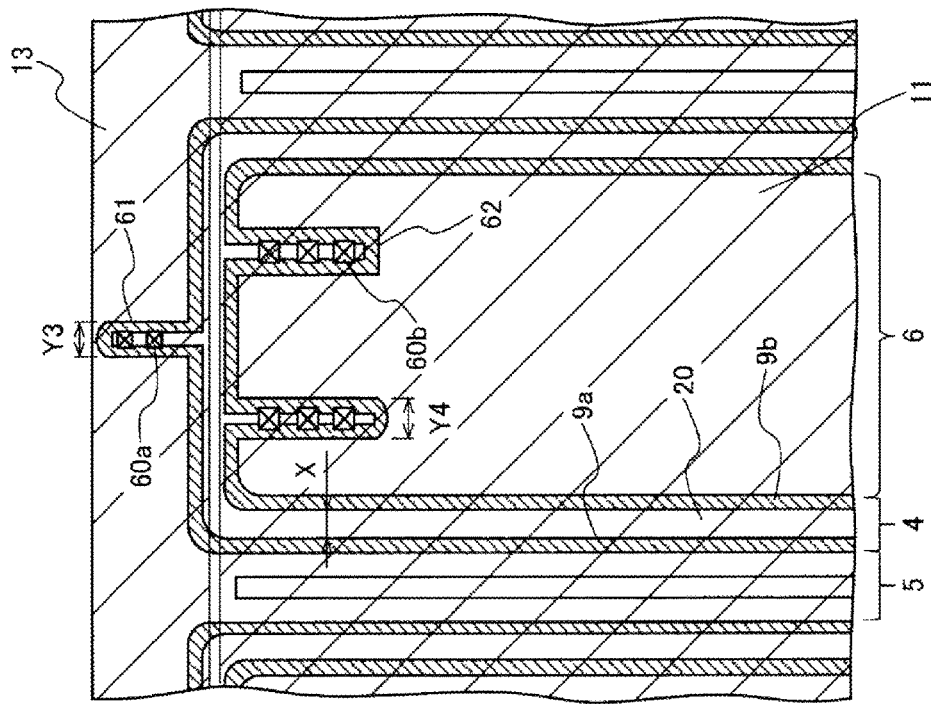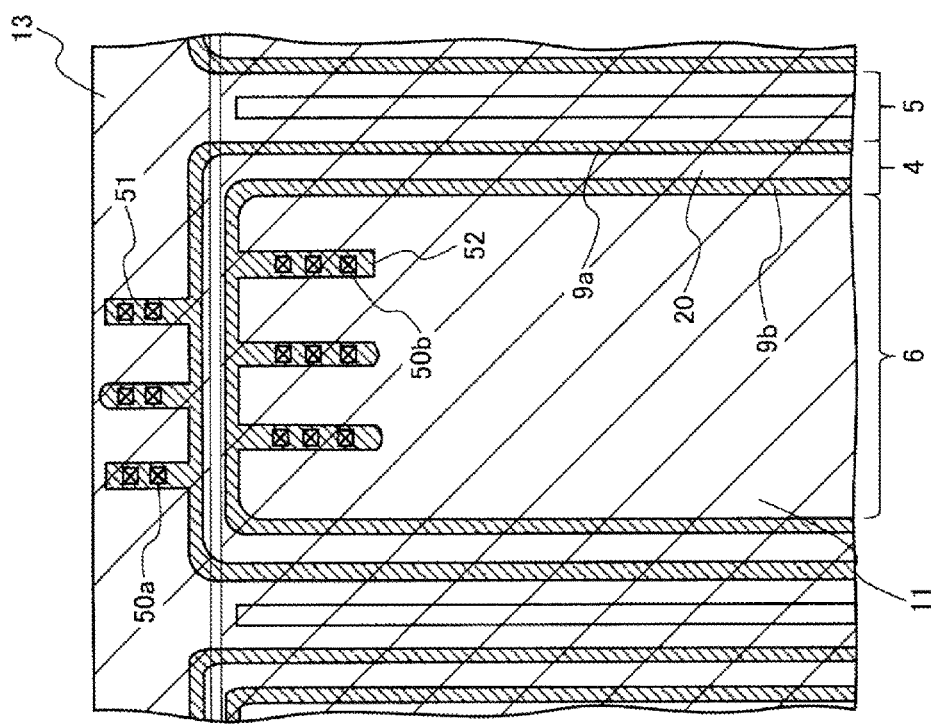

FIG. 20A
FIG. 20B
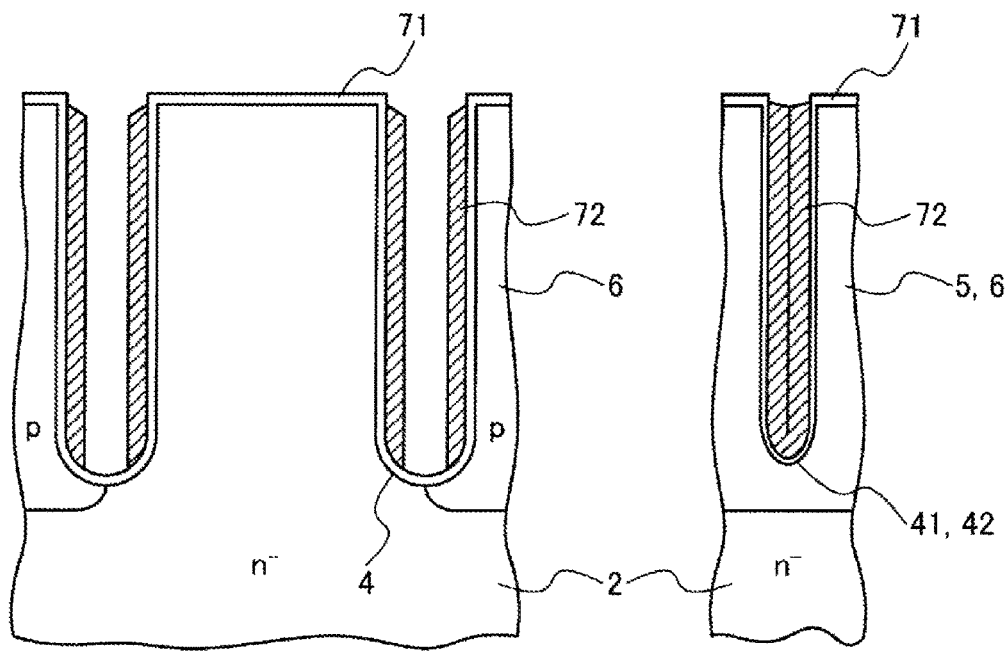
FIG. 21A
FIG. 21B
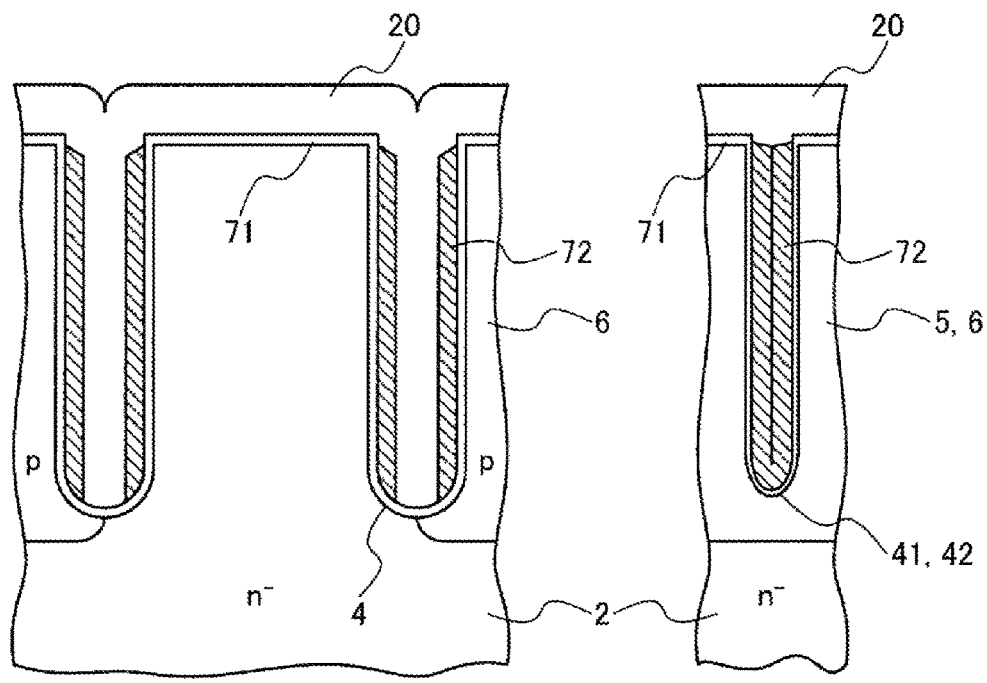

SEMICONDUCTOR DEVICE AND METHOD FOR FABRICATING SEMICONDUCTOR DEVICE

This application is a continuation under 35 U.S.C. 120 of International Application PCT/JP2014/060264 having the International Filing Date of Apr. 9, 2014, and having the benefit of the earlier filing date of Japanese Application No. 2013-083396, filed Apr. 11, 2013. Each of the identified applications is fully incorporated herein by reference.

TECHNICAL FIELD

The present invention relates to a semiconductor device and a method for fabricating the semiconductor device.

BACKGROUND ART

As the power consumption of power convertors becomes progressively less, lower power consumption is demanded for power devices (switching devices) which are a major component of power convertors. Among power devices, the use of a voltage driven type insulated gate bipolar transistor (IGBT) is becoming common, since the ON-state voltage drop can be decreased by the conductivity modulation effect, and current can be easily controlled by using the voltage applied to the insulation gate.

As an MOS gate (insulation gate constituted by a metal oxide film semiconductor) structure of an IGBT, a planar gate structure where a gate electrode is disposed on the front surface of the substrate, and a trench gate structure where a gate electrode is embedded in a trench created on the front surface side of the substrate, are well known. Lately the application fields of a trench gate type IGBT, where channels are formed along both side walls of the trench, are increasing since the channel density is higher and the ON-state voltage drop can be lower than a planar gate type IGBT, where channels are formed along the front surface of the substrate.

A configuration of a typical trench gate type IGBT will now be described. FIG. 27 is a cross-sectional view depicting the configuration of a typical trench gate type IGBT. As illustrated in FIG. 27, a p-layer 103 is disposed on a front surface side ($n^-$ drift layer 102 side) of a silicon substrate constituted by the $n^-$ drift layer 102, which is stacked on a front surface of a $p^+$ semiconductor substrate which becomes a $p^+$ collector region 101. The p-layer 103 is separated into a p-base region 105 and a floating p-region 106 by a plurality of trenches 104 which penetrate the p-layer 103 from the front surface of the silicon substrate to the $n^-$ drift layer 102.

The p-base region 105 is a region between the side walls on the $n^+$ emitter region 107 side of the adjacent trenches 104 of the p-layer 103. The floating p-region 106 is a region between the side walls opposite the $n^+$ emitter region 107 side of the adjacent trenches 104 of the p-layer 103. The floating p-region 106 is insulated from the $n^-$ drift layer 102 by a pn junction, and is insulated from a gate electrode 109 by a gate insulation film 108. In other words, the floating p-region 106 is in the floating state.

A gate electrode 109 is disposed inside the trench 104 via the gate insulation film 108. The $n^+$ emitter region 107 contacts the gate insulation film 108 formed on the side wall on the p-base region 105 side of the trench 104. The emitter electrode 111 is electrically connected to the $n^+$ emitter region 107 and the p-base region 105, and is insulated from the gate electrode 109 by an inter-layer insulation film 110. The emitter electrode 111 is covered by a passivation protective film (not illustrated) which is constituted by a silicon nitride ($Si_3N_4$ film) or a polymide film. A collector electrode 112 contacts the $p^+$ collector region 101.

In the IGBT illustrated in FIG. 27, the emitter electrode 111 is normally in a grounded state or in a state where negative voltage is applied. The collector electrode 112 is in a state where positive voltage is applied. Even if a voltage higher than the emitter electrode 111 is applied to the collector electrode 112 like this, current does not flow between the emitter and the collector if the voltage applied from a gate drive circuit (not illustrated) to the gate electrode 109 via the gate resistance is lower than a threshold, since the pn junction between the p-base region 105 and the $n^-$ drift layer 102 is in the reverse bias state. In other words, the IGBT maintains the OFF state.

On the other hand, if voltage exceeding the threshold is applied from the gate drive circuit to the gate electrode 109 via the gate resistance in a state where a voltage higher than the emitter electrode 111 is applied to the collector electrode 112, electric charges are stored in the gate electrode 109 and concurrently the region contacting the trench 104, between the $n^+$ emitter region 107 and the $n^-$ drift layer 102, out of the p-base region 105, is inverted, and an n-type channel region is formed. Thereby electrons emitted from the emitter electrode 111 are injected into the $n^-$ drift layer 102 via the emitter region 107 and the n-type region constituted by the channel region.

If electrons are injected into the $n^-$ drift layer 102, the pn junction between the $p^+$ collector region 101 and the $n^-$ drift layer 102 enters the forward bias state, and holes are injected from the collector electrode 112 into the $n^-$ drift layer 102, hence current flows between the emitter and the collector. In other words, the IGBT enters the ON state. The voltage effect generated between the emitter electrode 111 and the collector electrode 112 in this ON state is the ON-state voltage drop. By decreasing the voltage applied to the gate electrode 109 to the threshold or less, the electric charges stored in the gate electrode 109 are discharged to the gate drive circuit via the gate resistor.

Then when the electric charges stored in the gate electrode 109 are discharged to the gate drive circuit, the portion that inverted to the n-type, out of the p-base region 105, returns to the p-type and the channel region disappears, therefore no electrons are supplied from the emitter electrode 111 to the $n^-$ drift layer 102. As a result, no holes are supplied from the collector electrode 112 to the $n^-$ drift layer 102, and the electrons and holes stored in the $n^-$ drift layer 102 are discharged to the collector electrode 112 and the emitter electrode 111 respectively, or they disappear due to the recombination with each other, whereby current no longer flows between the emitter and the collector. In other words, the IGBT enters OFF state.

Various proposals have been made to further reduce the ON-state voltage drop of this trench gate type IGBT. For example, an IGBT called an IEGT (Injection Enhanced Gate bipolar Transistor), which has limit characteristics that are close to the ON-state voltage drop of a diode, is known (see, for example, Patent Document 1 (FIG. 101)). In the IEGT, a part of the $n^+$ emitter region and the p-base region is covered by an insulation film, so that the contact area between the $n^+$emitter region and the p-base region and the emitter electrode is reduced.

The operation of the IEGT disclosed in Patent Document 1 is essentially the same as the trench gate type IGBT described above, but in the case of the IEGT disclosed in Patent Document 1, holes near the p-base region covered by the insulation film are not easily discharged to the emitter electrode in the n⁻ drift layer, and accumulate in this portion. Therefore the hole density in an area near the p-base region increases in the n⁻ drift layer, and the injection of electrons increases accordingly. As a result, the carrier concentration distribution in the n⁻ drift layer becomes close to the carrier concentration distribution of the diode, and the ON-state voltage drop becomes lower than the ordinary trench gate type IGBT.

However, not only low ON-state voltage drop but also high-speed switching is demanded for a power converter, and the improvement of high-speed switching characteristics is one major issue. Further, in the trench gate types IGBT and IEGT, a trench gate structure is disposed at high density, which increases the capacitance between the gate and the emitter. Therefore the capacitance between the gate and the emitter must be charged when the OFF state shifts to the ON state, and the electric charges stored in the capacitance between the gate and the emitter must be discharged when the ON state shifts to the OFF state.

Therefore if the capacitance between the gate and the emitter is large, the switching loss increases as the charging/discharging time increases during the switching operation, and the power generation loss of the power device increases. The power generation loss of the power device is a total of the steady-state loss determined by the ON-state voltage drop and the switching loss generated during the switching operation. Therefore it is critical to decrease the capacitance between the gate and the emitter, which is a cause of generating the switching loss. An IGBT having a floating p-region, as illustrated in FIG. 27, has been proposed as an IGBT in which such a problem is solved (e.g. see Patent Document 2 (FIG. 1)).

In Patent Document 2, the floating p-region 106 in the floating state is created so that the holes, which were injected into the n⁻ drift layer 102, are not discharged into the emitter electrode 111 and stored in the floating p-region 106, whereby the carrier concentration distribution of the n⁻ drift layer 102 is made to be similar to the carrier concentration distribution of the diode. Further, in Patent Document 2, a dummy gate (a trench gate structure that does not function as a control electrode) is not disposed in the floating p-region 106 in the floating state, so as to reduce the capacitance between the gate and the emitter, to shorten the charge/discharge time, and to decrease the switching loss.

A common problem to the structures disclosed in Patent Document 1 and Patent Document 2 is that the turn ON characteristics must be improved (e.g. see Non-patent Document 1). As an IGBT in which this problem is solved and switching loss if further decreased, an IGBT where the gate electrode which functions as a control electrode and a dummy gate electrode of the emitter potential are disposed inside a same trench has been proposed (e.g. see Patent Document 3 and Patent Document 4). Moreover, a device in which contact resistance is reduced by forming a gate connection hole (contact hole) of which width is wider than the width of the trench, on the inter-layer insulation film on the polysilicon for a gate contact, has been proposed (see, for example, Patent Document 5).

Patent Document 1: Japanese Patent Application Laid-open No. H5-243561

Patent Document 2: Japanese Patent Application Laid-open No. 2001-308327

Patent Document 3: U.S. Pat. No. 6,815,769

Patent Document 4: Japanese Patent Application Laid-open No. 2012-064641

Patent Document 5: Japanese Patent Application Laid-open No. 2008-085278

Non-patent Document 1: M. Yamaguchi and seven others: IEGT Design Criterion for Reducing EMI Noise, Proceedings of 2004 International Symposium on Power Semiconductor devices and ICs, May 2004, pp. 115-118

In Patent Documents 3 to 5, however, when the gate electrodes are formed along both side walls of the trench respectively, the polysilicon film, which becomes the gate electrodes, is formed along the inner wall of the trench first, then the polysilicon film on the bottom surface of the trench is removed by standard photolithography and etching in a state where the polysilicon film remains on the front surface of the silicon substrate, so as to separate the gate electrodes inside the trench. This means that a number of process steps is very high, which increases cost or drops the non-defective product ratio. Further, resist enters the trench if a resist mask for etching to remove the polysilicon film on the bottom surface of the trench is formed by standard photolithography. For IGBT in particular, the aspect ratio of the trench is high, therefore it is difficult to remove the resist that entered into the trench, and resist residue is generated, which drops yield and reliability.

SUMMARY

To solve the problems of the prior art described above, it is an object of the present invention to provide a semiconductor device that has gate electrodes along both side walls of the trench respectively, and a method for fabricating the semiconductor device, whereby the fabrication process can be shortened. Moreover, to solve the problems of the prior art described above, it is an object of the present invention to provide a highly reliable semiconductor device with low switching loss, and a method for fabricating the semiconductor device.

To solve the above problems and achieve the objects of the present invention, a semiconductor device according to the present invention is a semiconductor device having a trench structure that includes: a first trench that is formed in a surface layer of a first conductive type semiconductor layer; a second conductive type base region that is selectively formed on the surface layer of the semiconductor layer at a depth shallower than the first trench, along one side wall of the first trench; an emitter region that is formed on the surface layer of the base region so as to contact the side walls of the first trench; and a second conductive type floating potential region that is selectively formed on the surface layer of the semiconductor layer along the other side wall of the first trench, and has the following characteristics. A first insulation film is disposed along one side wall of the first trench. A second insulation film is disposed along the other side wall of the first trench. A first gate electrode is disposed along one side wall of the first trench on the inner side of the first insulation film. A shield electrode is disposed along the other side wall of the first trench on the inner side of the second insulation film. A third insulation film is embedded in the first trench between the first gate electrode and the shield electrode. An inter-layer insulation film, that covers the first gate electrode, the shield electrode and the emitter region, is disposed. A second gate electrode, an emitter electrode that is distant from the second gate electrode, and a fixed-potential electrode that is distant from the second gate electrode, are disposed on the inter-layer insulation film. A first contact hole is selectively disposed on the inter-layer insulation film in a portion between the second gate electrode and the first gate electrode. A first contact plug for conductively connecting the second gate electrode and the first gate electrode is embedded in the first contact hole. A second contact hole is selectively disposed on the inter-layer insulation film in a portion between the fixed-potential electrode and the shield electrode. A second contact plug for conductively connecting the fixed-potential electrode and the shield electrode is embedded in the second contact hole. A third contact hole is selectively disposed on the inter-layer insulation film in a portion between the emitter electrode and the emitter region. A third contact plug for conductively connecting the emitter electrode and the emitter region is embedded in the third contact hole.

The semiconductor device according to the present invention described above is characterized in that the fixed-potential electrode is integrated with the emitter electrode.

In the semiconductor device according to the present invention described above, a second trench is connected to one side wall of the first trench. A third trench is connected to the other side wall of the first trench. The first insulation film is disposed inside the second trench along the inner wall of the second trench. The second insulation film is disposed inside the third trench along the inner wall of the third trench. The first gate electrode is disposed on the inner side of the first insulation film inside the second trench. The shield electrode is disposed on the inner side of the second insulation film inside the third trench. The second gate electrode is conductively connected via the first contact plug to the first gate electrode disposed inside the second trench. The fixed-potential electrode is conductively connected via the second contact plug to the shield electrode disposed inside the third trench.

The semiconductor device according to the present invention described above is characterized in that the width of the second trench is narrower than the width of the first trench.

The semiconductor device according to the present invention described above is characterized in that the width of the third trench is narrower than the width of the first trench.

The semiconductor device according to the preset invention described above is characterized in that both ends of the second trench and the third trench are connected to the first trench.

The semiconductor device according to the present invention described above is characterized in that the second trench is disposed at a distance from the emitter region.

The semiconductor device according to the present invention described above is characterized in that the third trench is disposed in the floating potential region.

To solve the above problems and achieve the objects of the present invention, a method for fabricating a semiconductor device according to the present invention is a method for fabricating a semiconductor device that has a trench structure in which an emitter region is disposed only on one side wall of a first trench, and has the following characteristics. First a first step of forming the first trench on a surface layer of a first conductive type semiconductor layer is performed. Then a second step of forming a first insulation film inside the first trench along the inner wall of the first trench is performed. Then a third step of forming a conductor layer inside the first insulation film along the inner wall of the first trench is performed. Then a fourth step of selectively removing the conductor layer on the surface of the semiconductor layer and the conductor layer on the bottom surface of the first trench, and separating the conductive layer into a shield electrode and a first gate electrode is performed. Then a fifth step of embedding the second insulation film between the shield electrode and the first gate electrode inside the first trench is performed. Then a sixth step of selectively forming a second conductive type of base region, of which depth is shallower than the first trench, on the surface layer of the semiconductor layer, so as to contact a side wall of the first trench on the first gate electrode side, is performed. Then a seventh step of selectively forming a second conductive type floating potential region on the surface layer of the semiconductor layer, so as to contact the side wall of the first trench on the shield electrode side, is performed. Then an eighth step of forming a second conductive type emitter region on the surface layer of the base region, so as to contact the first trench, is performed. Then a ninth step of forming an inter-layer insulation film that covers the shield electrode, the first electrode and the emitter region, is performed. Then a tenth step of selectively removing the inter-layer insulation film and forming a first contact hole that selectively exposes the first gate electrode on one side wall of the first trench, a second contact hole that selectively exposes the shield electrode on the other side wall of the first trench, and a third contact hole that selectively exposes the emitter region, is performed. Then an eleventh step of forming a contact plug, so as embed the first contact hole, the second contact hole and the third contact hole, is performed. Then a twelfth step of forming, on the inter-layer insulation film, a second gate electrode so as to cover the first contact hole, forming a fixed-potential electrode so as to cover the second contact hole, and forming an emitter electrode so as to cover the third contact hole, is performed.

In the method for fabricating a semiconductor device according to the present invention described above, a second trench connected to one side wall of the first trench and a third trench connected to the other side wall of the first trench are formed in the first step. The first insulation film is formed along the inner walls of the second trench and the third trench in the second step. The conductor layer is embedded in the first insulation film of the second trench and the third trench in the third step. The first contact hole that selectively exposes the first gate electrode embedded in the second trench and the second contact hole that selectively exposes the shield electrode embedded in the third trench are formed in the tenth step.

In the method for fabricating a semiconductor device according to the present invention described above, a second trench connected to one side wall of the first trench and a third trench connected to the other side wall of the first trench are additionally formed in the first step. The first insulation film is formed along the inner walls of the second trench and the third trench in the second step. The conductor layer is formed inside the first insulation film of the second trench and the third trench along the inner wall of the first trench in the third step. The conductor layer on the bottom surface of the second trench and on the bottom surface of the third trench is selectively removed in the fourth step. The second insulation film is embedded between the first gate electrodes inside the second trench, and the second insulation film is embedded between the shield electrodes inside the third trench in the fifth step. The first contact hole that selectively exposes the first gate electrode embedded in the second trench and the second contact hole that selectively exposes the shield electrode embedded in the third trench are formed in the tenth step.

In the method for fabricating a semiconductor device according to the present invention described above, the width of the second trench is narrower than the width of the first trench.

In the method for fabricating a semiconductor device according to the present invention described above, the width of the third trench is narrower than the width of the first trench.

According to the invention described above, the first gate electrode and the shield electrode are disposed along both side walls of the trench (first trench) via the first and second insulation films respectively, and are directly and conductively connected to each metal electrode (second gate electrode and fixed-potential electrode) respectively, whereby the polysilicon film (conductor layer) that extends from the inner walls of the trenches, to be the first gate electrode and the shield electrode, do not remain on the front surface of the silicon substrate. Therefore after the polysilicon film is formed from the front surface of the silicon substrate to the inner walls of the trenches, the polysilicon film, to be the first gate electrode and the shield electrode, can remain only on the side walls of the trenches by performing etch back on the polysilicon film without using a resist mask. This means that the conventional patterning step of the polysilicon film using photolithography and etching can be omitted.

Moreover, according to the present invention described above, the first gate electrode and the shield electrode can be formed along both side walls of the trench, without performing the patterning step for the polysilicon film using a resist mask, hence the generation of resist residue in the trenches can be prevented. This prevents a drop in yield and reliability upon fabricating the semiconductor device, which includes the first gate electrode and the shield electrode on both side walls of the trench respectively. Furthermore, the capacitance between the gate and the emitter can be decreased by conductively connecting the shield electrode on the floating p-region side to the fixed-potential electrode of the emitter electrode to improve the turn ON characteristic.

By using the semiconductor device and the method for fabricating the semiconductor device according to the present invention, the fabrication process can be shortened upon fabricating a semiconductor device, which includes gate electrodes along both side walls of the trench respectively. Further, by using the semiconductor device and the method for fabricating the semiconductor device according to the present invention, a highly reliable semiconductor device with low switching loss can be provided.

BRIEF DESCRIPTION OF THE DRAWINGS

FIG. 1B is an enlarged plan view depicting a configuration of the Z portion enclosed by the broken line in FIG. 1A;

FIGS. 17A and 17B are plan views depicting a configuration of a semiconductor device according to Embodiment 4;

FIGS. 20A and 20B are cross-sectional views depicting a state upon fabricating the semiconductor device according to Embodiment 5;

FIGS. 21A and 21B are cross-sectional views depicting a state upon fabricating the semiconductor device according to Embodiment 5;

DETAILED DESCRIPTION

Preferred embodiments of a semiconductor device and a method for fabricating the semiconductor device according to the present invention will now be described with reference to the accompanying drawings. In this description and in the accompanying drawings, a layer or a region to which n or p is prefixed means that electrons or holes are the majority carrier in a layer or region respectively. + or − suffixed to n or p as superscript means that a layer or region has a higher impurity concentration or lower impurity concentration respectively than a layer or region to which + or − is not suffixed. In the description on the embodiments and accompanying drawings, a same reference symbol is used for similar composing elements, where redundant description is omitted.

(Embodiment 1)

Figure 1A:
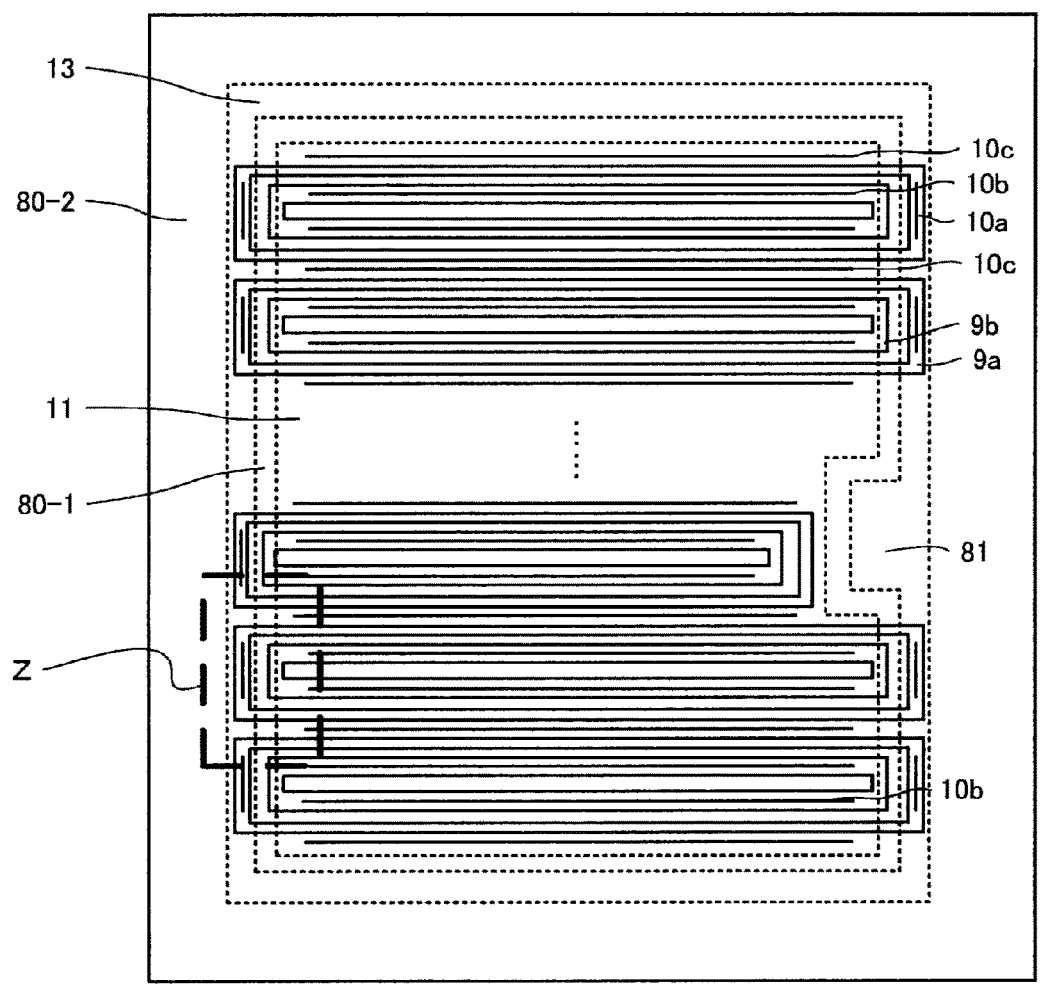
FIG. 1A is a plan view depicting a plane layout of a semiconductor device according to Embodiment 1.

A configuration of a semiconductor device according to Embodiment 1 will be described. FIG. 1A is a plan view depicting a plane layout of a semiconductor device according to Embodiment 1. FIG. 1B is an enlarged plan view depicting a configuration of the Z portion enclosed by the broken line in FIG. 1A. First the plane layout of the semiconductor device according to Embodiment 1 will be described. As illustrated in FIG. 1A and FIG. 1B, the semiconductor device according to Embodiment 1 includes an active region 80-1 where current flows in the ON state, and an edge termination region 80-2 that relaxes the electric field of the n⁻ drift layer on the front surface side of the silicon substrate, and maintains the withstand voltage. The edge termination region 80-2 surrounds the active region 80-1.

In the active region 80-1, the floating p-region 6 extends linearly. The shield electrode 9b has a substantially rectangular frame shape in the plan view, which surrounds the floating p-region 6. The first gate electrode 9a has a substantially rectangular frame shape in the plan view, and surrounds the shield electrode 9b. The region between the first gate electrode 9a and the shield electrode 9b is an insulation film (third insulation film) 20. The first gate electrode 9a, the shield electrode 9b and the insulation film 20 are disposed inside the trench 4 that has a substantially rectangular frame shape in the plan view. A plurality of trenches 4, in each of which the first gate electrode 9a, the shield electrode 9b and the insulation film 20 are disposed, is disposed in parallel in the short direction of the trench 4. The region between the adjacent first gate electrodes 9a is a p-base region 5.

The emitter electrode (second electrode) 11 is disposed on the surfaces of the p-base region 5, the floating p-region 6, the first gate electrode 9a and the shield electrode 9b via an inter-layer insulation film. The gate runner (second gate electrode) 13 has a substantially rectangular frame shape in the plan view, and is disposed in the outer periphery of the active region 80-1 so as to surround the emitter electrode 11. The active region 80-1 is a region on the inner side of the gate runner 13 (including the gate runner 13). The gate runner 13 is disposed such that a part of the gate runner 13 overlaps with the short side portion of the first gate electrode 9a. A gate pad 81 is selectively disposed between the gate runner 13 and the emitter electrode 11, and the gate runner 13 is connected to the gate pad 81.

FIG. 1B is a plane layout of the emitter electrode 11 and the gate runner 13, which are indicated by hatched diagonal lines, differentiating them from the first gate electrode 9a and the shield electrode 9b. For example, the emitter electrode 11 is disposed in an area from the p-base region 5 to the floating p-region 6, so as to cover a portion perpendicular to the direction in which the p-base region 5 and the floating p-region 6 are alternately disposed, out of the trench 4 which has a substantially rectangular shape (hatched diagonal lines on the lower side of FIG. 1B). The gate runner 13 is disposed so as to cover a portion in parallel with the direction in which the p-base region 5 and the floating p-region 6 are alternately disposed, out of the trench 4 which has a substantially rectangular shape in the plan view (diagonal hatching on the upper side of FIG. 1B).

In the inter-layer insulation film, the first to third contact holes 10a to 10c, each of which has a substantially rectangular shape in the plan view, are disposed. The first contact hole 10a extends on the short side portion of the first gate electrode 9a along the short side portion of the first gate electrode 9a. The second contact hole 10b extends on the long side portion of the shield electrode 9b along the long side portion of the shield electrode 9b. The third contact hole 10c extends on the p-base region 5 along the extending direction of the p-base region 5. The first to third contact holes 10a to 10c may be a plurality of contact holes having a substantially square shape in the plan view, disposed at predetermined intervals.

Figure 2:
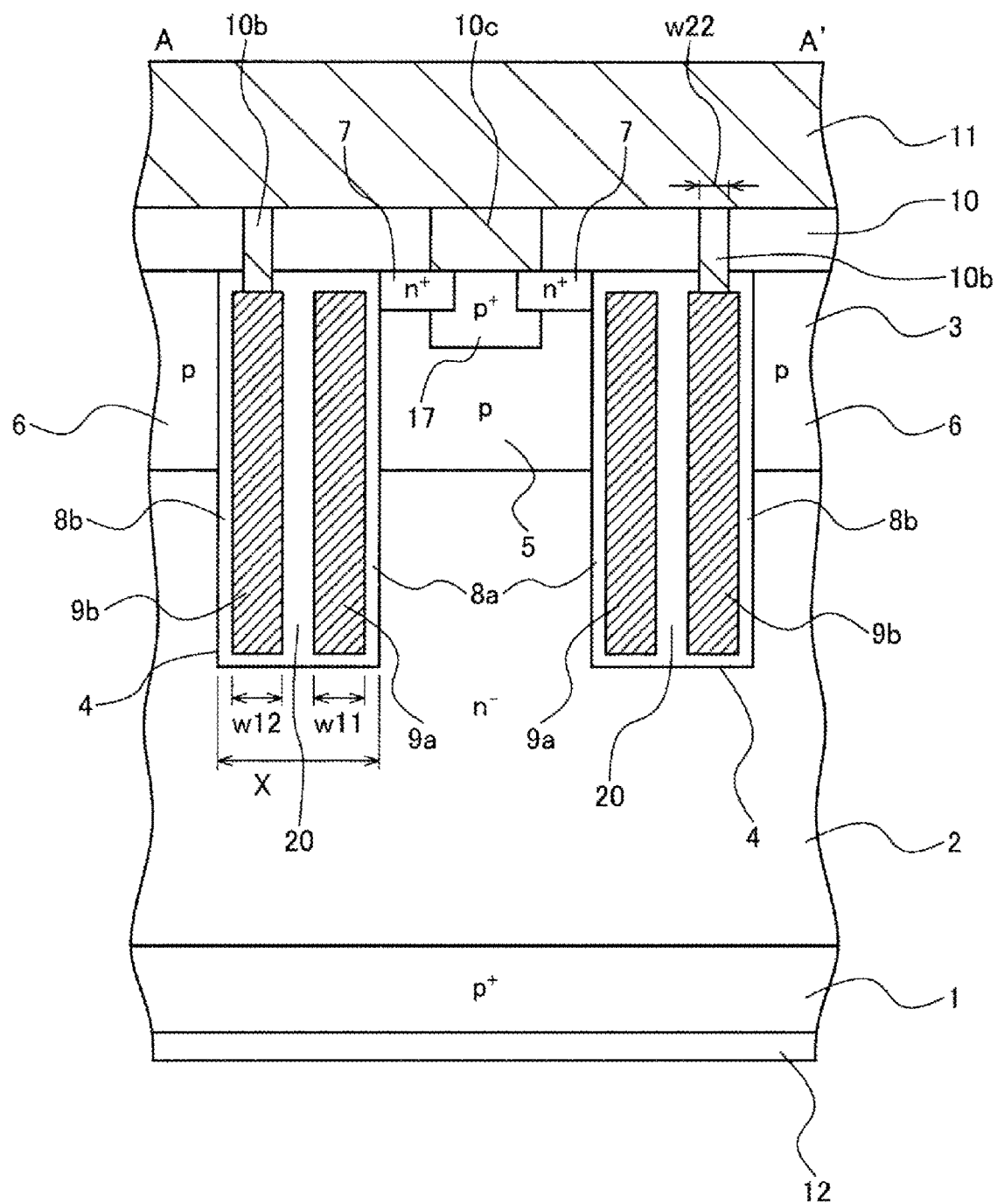
FIG. 2 is a cross-sectional view depicting the cross-sectional structure at the A-A' line in FIG. 1B.
Figure 3:
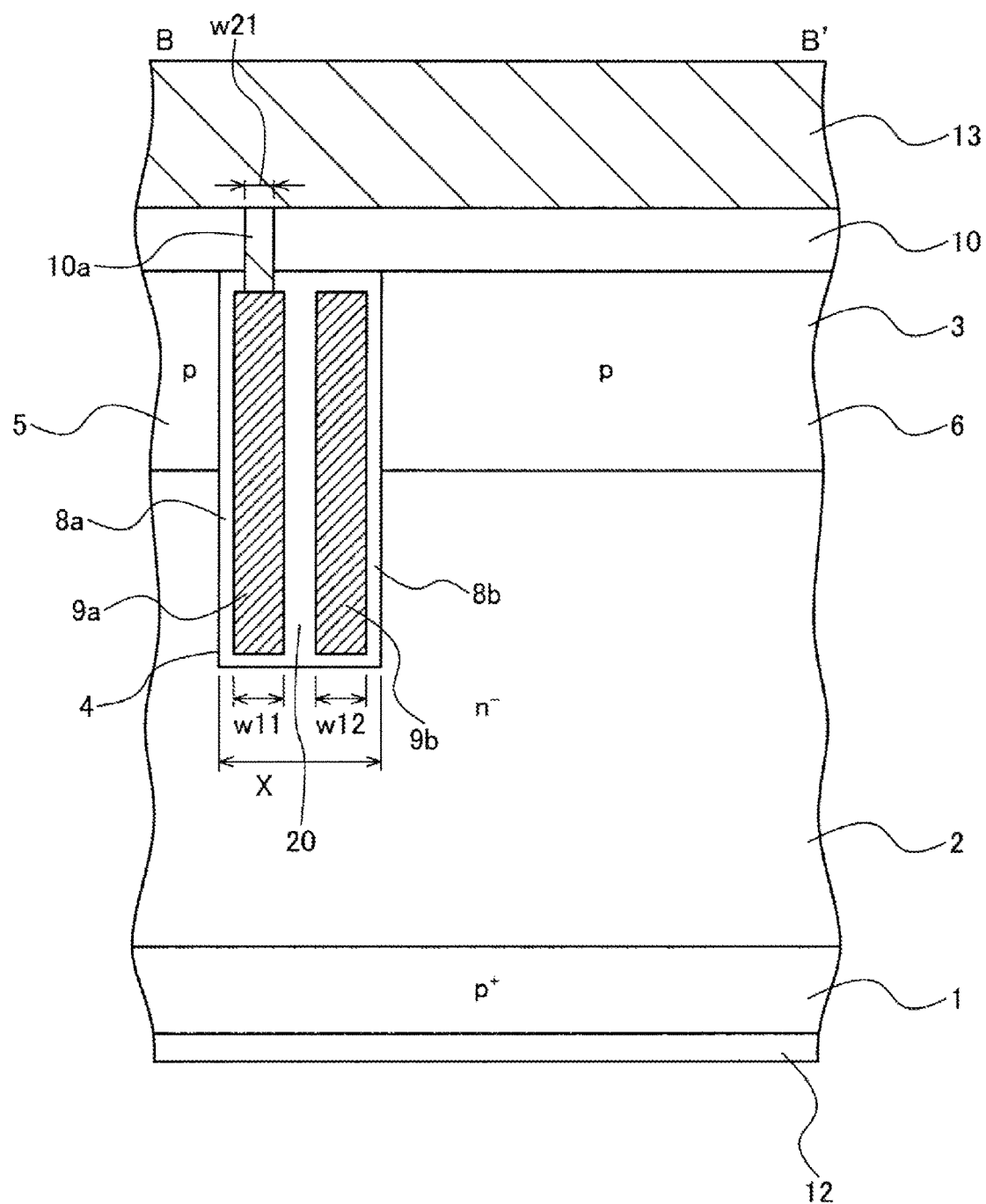
FIG. 3 is a cross-sectional view depicting a cross-sectional structure at the B-B' line FIG. 1B.

Now the cross-sectional structure of the semiconductor device according to Embodiment 1 will be described. FIG. 2 is a cross-sectional view depicting a cross-sectional structure at the A-A' line in FIG. 1B. FIG. 3 is a cross-sectional view depicting a cross-sectional structure at the B-B' line in FIG. 1B. As illustrated in FIG. 2 and FIG. 3, in the silicon substrate constituted by the n drift layer 2 stacked on the front surface of a p⁺ semiconductor substrate to be a p⁺ collector region 1, a p-layer 3 is disposed on the surface layer of the n⁻ drift layer 2 on the front surface side of the silicon substrate.

In the p-layer 3, a plurality of trenches 4 that reach from the front surface of the silicon substrate to the n⁻ drift layer 2 via the p-layer 3 is disposed. Each trench 4 has a substantially rectangular frame shape in the plan view, and is disposed so as to face the emitter electrode 11 and the gate runner 13 (described later) via the inter-layer insulation film 10. By these trenches 4, the p-layer 3 is separated into p-base regions 5 and floating p-regions 6 in mesa shapes. The p-base region 5 is a region enclosed by side walls outside the trenches 4, and the floating p-region 6 is a region enclosed by side walls inside the trenches 4.

In other words, the p-base region 5 and the floating p-region 6 are alternately disposed. An n⁺ emitter region 7 and a p⁺ contact region 17 are selectively disposed inside the p-base region 5. The n⁺ emitter region 7 contacts an insulation film (later mentioned first insulation film 8a) disposed on a side wall outside the trench 4. The n⁺ emitter region 7 and the p⁺ contact region 17 do not exist in the floating p-region 6. The floating p-region 6 is insulated from the n⁻ drift layer 2 by the pn junction with the n⁻ drift layer 2.

The floating p-region 6 is also insulated from the shield electrode 9b inside the trench 4 by an insulation film (later mentioned second insulation film 8b) disposed along the side wall of the trench 4. In other words, the floating p-region 6 is in the so called "floating state". In this floating p-region 6, holes are stored in the ON state. In FIG. 2 and FIG. 3, the floating p-region 6, of which depth is shallower than the depth of the trench 4, is illustrated, but the depth of the floating p-region 6 may be deeper than the depth of the trench (first trench) 4 as described later in Embodiment 2, and in this case, it is preferable, for example, to dispose the floating p-region 6 in such a way so as to cover the corner portion of the bottom surface of each trench 4. Thereby the electric field near the bottom surface of the trench 4 can be relaxed.

An insulation film is formed inside each trench 4 along the inner wall of the trench 4. To clarify the positions of the first gate electrode 9a and the shield electrode 9b in the trench 4, the insulation film formed from the side wall of the trench 4 on the p-base region 5 side to the bottom surface is called the "first insulation film 8a", and the insulation film formed from the side wall of the trench 4 on the floating p-region 6 side to the bottom surface is called the "second insulation film 8b". Inside the trench 4, the first gate electrode 9a and the shield electrode 9b are disposed on the inner side of the first insulation film 8a and the second insulation film 8b respectively.

The width w11 of the first gate electrode 9a and the width w12 of the shield electrode 9b may be about 0.5 μm, with respect to the trench 4 of which width X is about 2 μm, for example. The first gate electrode 9a and the shield electrode 9b may be constituted by a conductor layer of polysilicon (poly-Si) or a high melting point metal, for example. An insulation film 20 is disposed in a portion between the first gate electrode 9a and the shield electrode 9b. The first gate electrode 9a and the shield electrode 9b are insulated from each other by the insulation film 20. The insulation film 20 may be an oxide film having high embedability, such as an HTO (High Temperature Oxide) film or a TEOS (TetraEthOxySilane) film.

An inter-layer insulation film 10 is disposed on the front surface of the silicon substrate so as to cover the p-base region 5, the floating p-region 6, the first gate electrode 9a and the shield electrode 9b. On the inter-layer insulation film 10, the emitter electrode 11 and the gate runner 13 are selectively disposed so as to cover the inter-layer insulation film 10. The emitter electrode 11 and the gate runner 13 are disposed at a distance from each other. In the inter-layer insulation film 10, the first to third contact holes 10a to 10c are disposed along the side walls of each trench 4, as illustrated in the plane layout mentioned above.

In concrete terms, the first contact hole 10a is selectively disposed in the inter-layer insulation film 10 in the portion covered by the gate runner 13, so as to selectively expose the first gate electrode 9a. The second contact hole 10b is selectively disposed in the inter-layer insulation film 10 in the portion covered by the emitter electrode 11, so as to selectively expose the shield electrode 9b. The width w21 of the first contact hole 10a is narrower than the width w11 of the first gate electrode 9a, for example, about 0.25 μm when the width w11 of the first gate electrode 9a is about 0.5 μm. The width w22 of the second contact hole 10b is narrower than the width w12 of the shield electrode 9b, such as about 0.25 μm when the width w12 of the shield electrode 9b is about 0.5 μm. The third contact hole 10c is selectively disposed in the inter-layer insulation film 10 in a portion covered by the emitter electrode 11, so as to selectively expose the emitter region 7 and the $p^+$ contact region 17.

A barrier metal film (not illustrated) constituted by, for example, a titanium (Ti) film or a titanium nitride (TiN) film, is disposed inside the first to third contact holes 10a to 10c on the silicon substrate side, and a tungsten (W) film is embedded on the barrier metal film. Thereby the first gate electrode 9a is conductively connected to the gate runner 13 via the first contact hole 10a. The shield electrode 9b is conductively connected to the emitter electrode 11 via the second contact hole 10b. In other words, the first gate electrode 9a and the shield electrode 9b are directly connected with the contact plugs (including the barrier metal film and the tungsten film) disposed on the surfaces of the first gate electrode 9a and the shield electrode 9b respectively.

Since the shield electrode 9b is connected to the emitter electrode 11, the capacitance between the gate and the emitter can be reduced. The emitter electrode 11 is conductively connected to the $n^+$ emitter region 7 and the $p^+$ contact region 17 via the third contact hole 10c. The emitter electrode 11 is insulated from the first gate electrode 9a and the shield electrode 9b by the inter-layer insulation film 10. The emitter electrode 11 and the gate runner 13 are covered with a passivation protective film (not illustrated) constituted by a silicon nitride film or a polyimide film. The collector electrode 12 contacts the $p^+$ collector region 1.

Figure 4:
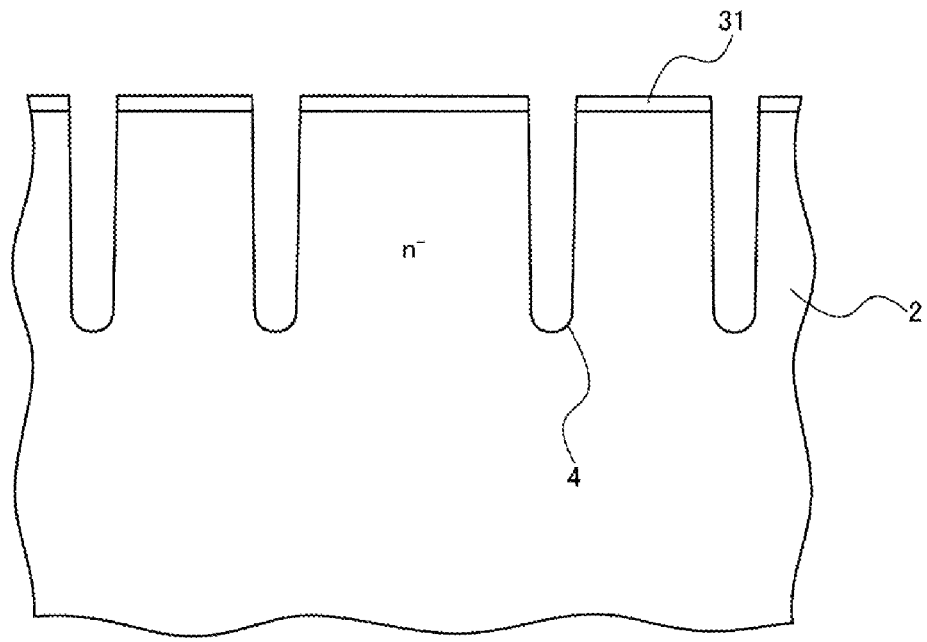
FIG. 4 is a cross-sectional view depicting a state during fabricating the semiconductor device according to Embodiment 1.

A method for fabricating the semiconductor device according to Embodiment 1 will now be described. FIG. 4 to FIG. 9 are cross-sectional views depicting states upon fabricating the semiconductor device according to Embodiment 1. First as illustrated in FIG. 4, a silicon substrate in which the $n^-$ drift layer 2 is stacked on the front surface of the $p^+$ semiconductor substrate to be the $p^+$ collector region (not illustrated). Then, on the $n^-$ drift layer 2 the resist mask 31 having openings in portions corresponding to the regions of the trenches 4 is formed. Then etching is performed using the resist mask 31 as a mask, whereby a plurality of trenches 4 is formed from the front surface side of the silicon substrate at a depth that does not reach the $p^+$ collector region. Then the resist mask 31 is removed.

Figure 5:
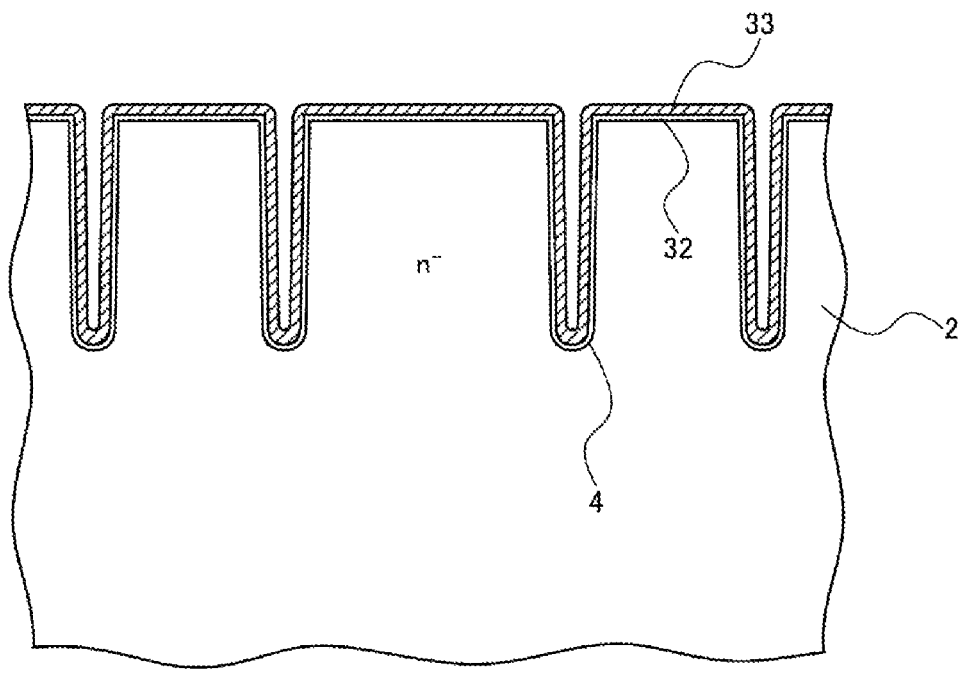
FIG. 5 is a cross-sectional view depicting a state during fabricating the semiconductor device according to Embodiment 1.
Figure 6:
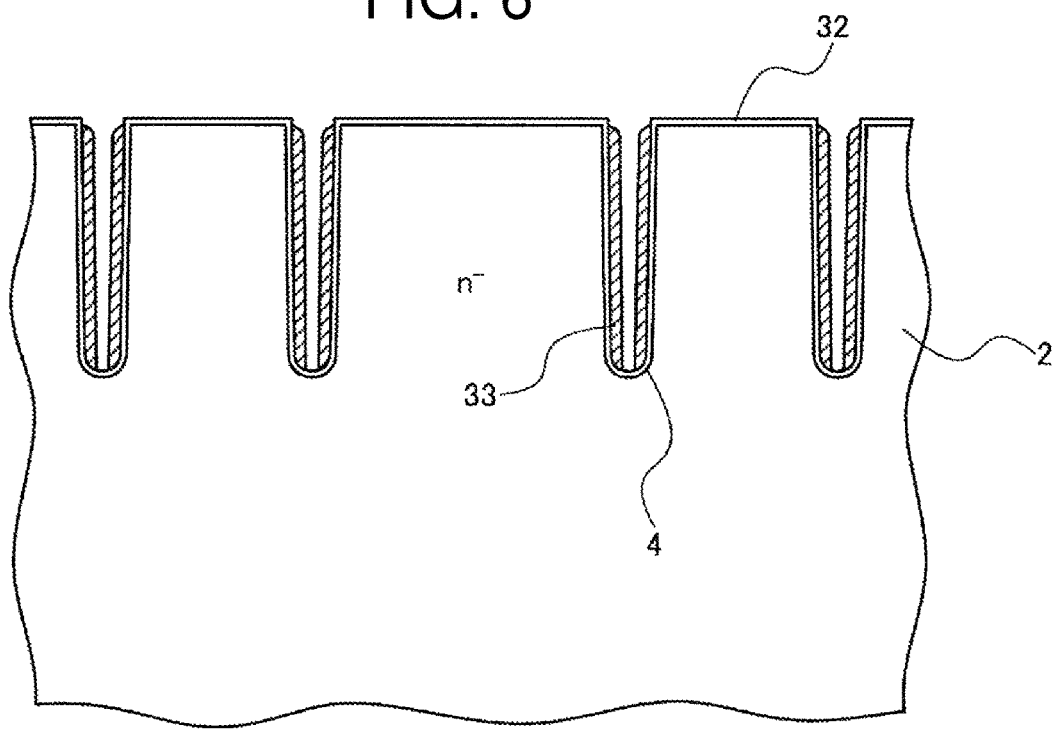
FIG. 6 is a cross-sectional view depicting a state during fabricating the semiconductor device according to Embodiment 1.

Then, as shown in FIG. 5, the insulation film 32 is formed inside the trenches 4 along the inner walls of the trenches 4. Then, on the inner side of the insulation film 32 the polysilicon film 33 as the conductor layer is formed on the inner walls of the trenches 4. At this time, the polysilicon film 33 is formed such that the inner side of the insulation film 32 is not embedded by the polysilicon film 33. Then as illustrated in FIG. 6, the polysilicon film 33 is etched back by anisotropic etching, so that the polysilicon films 33 on the front surface of the silicon substrate (surface of the $n^-$ drift layer 2) and the bottom surfaces of the trenches 4 are removed, and the polysilicon film 33 on the side walls of the trenches 4 remain. The polysilicon film 33 that remains on the side walls of the trenches 4 becomes the first gate electrode 9a and the shield electrode 9b.

Figure 7:
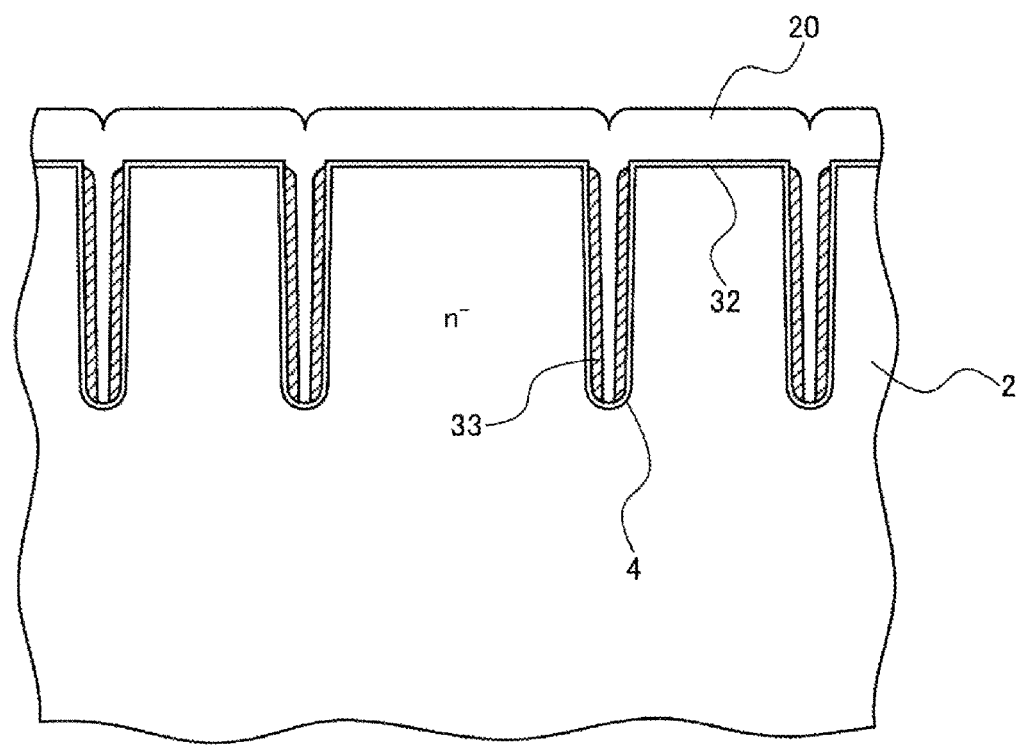
FIG. 7 is a cross-sectional view depicting a state during fabricating the semiconductor device according to Embodiment 1.
Figure 8:
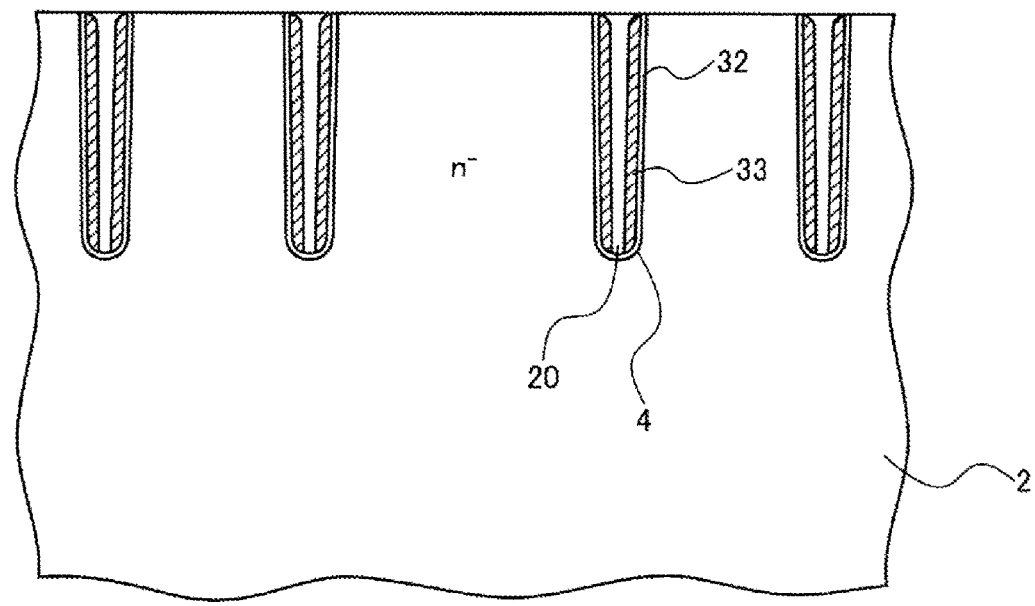
FIG. 8 is a cross-sectional view depicting a state upon fabricating the semiconductor device according to Embodiment 1.
Figure 9:
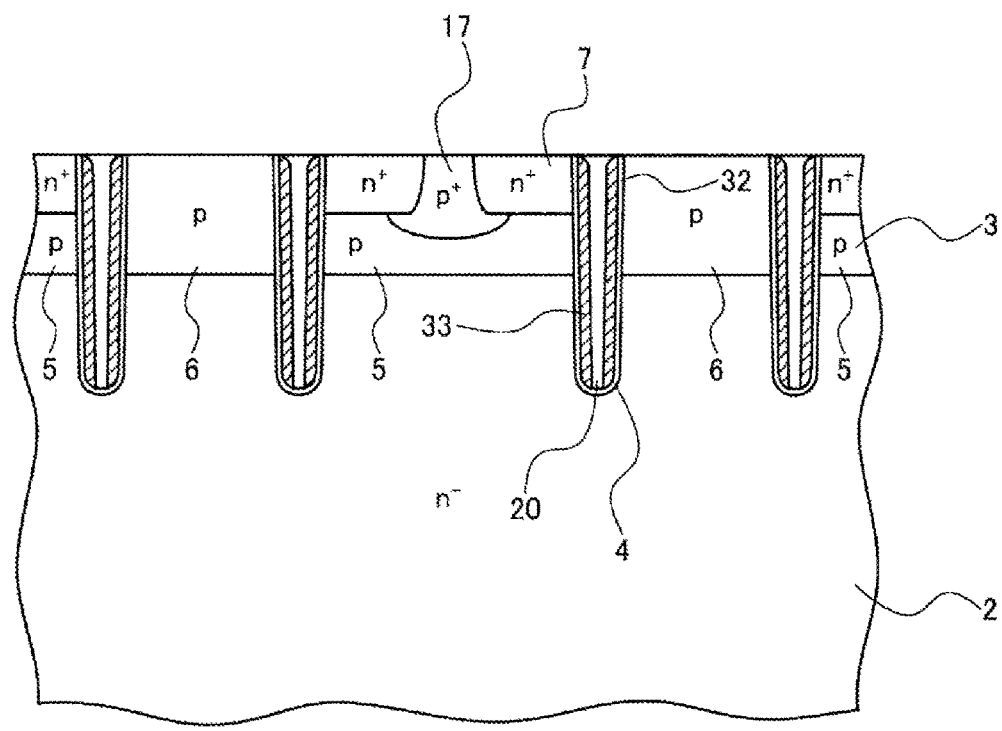
FIG. 9 is a cross-sectional view depicting a state during fabricating the semiconductor device according to Embodiment 1.

Then as illustrated in FIG. 7, the insulation film 20 is formed so as to embed the inner side of the polysilicon film 33 inside each trench 4. Then as illustrated in FIG. 8, the insulation films 20 and 32 are etched back, so as to remove the insulation films 20 and 32 on the front surface of the silicon substrate. Thereby the insulation film 20 remains on the inner side of the polysilicon film 33 inside each trench 4, and the insulation film 32 remains on the inner walls of each trench 4. The insulation film 32 that remains on the inner wall of each trench 4 is the first and second insulation films 8a and 8b. Then as illustrated in FIG. 9, p-type impurities such as boron (B) are ion-implanted into the front surface of the silicon substrate, so that the p-layer 3 is formed on the surface layer of the $n^-$ drift layer 2 at a depth that is deeper than the depth of the trench 4, for example. Thereby the p-base region 5 and the floating p-region 6 are formed in the p-layer 3, separated by the plurality of trenches 4.

Then a resist mask (not illustrated) having openings in portions corresponding to the region of the $n^+$ emitter region 7 is formed on the front surface of the silicon substrate. Then n-type impurities, such as phosphorus (P), are ion-implanted using this resist mask as a mask, and the $n^+$ emitter region 7 is formed on the surface layer of the p-base region 5. Then the resist mask used for forming the $n^+$ emitter region 7 is removed. Then a resist mask (not illustrated) having openings in partitions corresponding to the region of the $p^+$ contact region 17 is formed on the front surface of the silicon substrate. Then p-type impurities, such as boron, are ion-implanted using this resist mask as a mask, and the $p^+$ contact region 17 is formed on the surface layer of the p-base region 5, so as to contact the $n^+$ emitter region 7. After this, the resist mask used to form the $p^+$ contact region 17 is removed. The sequence of forming the $n^+$ emitter region 7 and the $p^+$ contact region 17 may be reversed.

Then the inter-layer insulation film 10 is formed on the entire front surface of the silicon substrate. Then the inter-layer insulation film 10 in portions corresponding to regions of the first to third contact holes 10a to 10c is removed by photolithography and etching. Thereby the polysilicon film 33 to be the first gate electrode 9a is selectively exposed in the first contact hole 10a, and the polysilicon film 33 to be the shield electrode 9b is selectively exposed in the second contact hole 10b. Further, the $n^+$ emitter region 7 and the $p^+$ contact region 17 are selectively exposed in the third contact hole 10c. Then, for example, the barrier metal film constituted by a titanium film or a titanium nitride film is formed inside the first to third contact holes 10a to 10c.

Then the tungsten film is formed so as to be embedded inside the first to third contact holes 10a to 10c. Then the tungsten film is etched back, so as to remove the tungsten film on the surface of the inter-layer insulation film 10. Then, for example, the aluminum silicon (Al—Si) electrode, for example, to be the emitter electrode 11 and the gate runner 13, is formed on the inter-layer insulation film 10. Thereby the polysilicon film 33 to be the first gate electrode 9a is conductively connected to the gate runner 13 via the barrier metal film and the tungsten film. The polysilicon film 33 to be the shield electrode 9b is conductively connected to the emitter electrode 11 via the barrier metal film and the tungsten film. Then the passivation film is formed on the surface of the silicon substrate, and the passivation film is selectively opened so that the gate pad 81 and the emitter electrode 11 are partially exposed. The exposed emitter electrode 11 becomes the emitter pad. Then the collector electrode 12 is formed on the rear surface of the silicon substrate, whereby the semiconductor device illustrated in FIG. 1A to FIG. 3 is completed.

Figure 10:
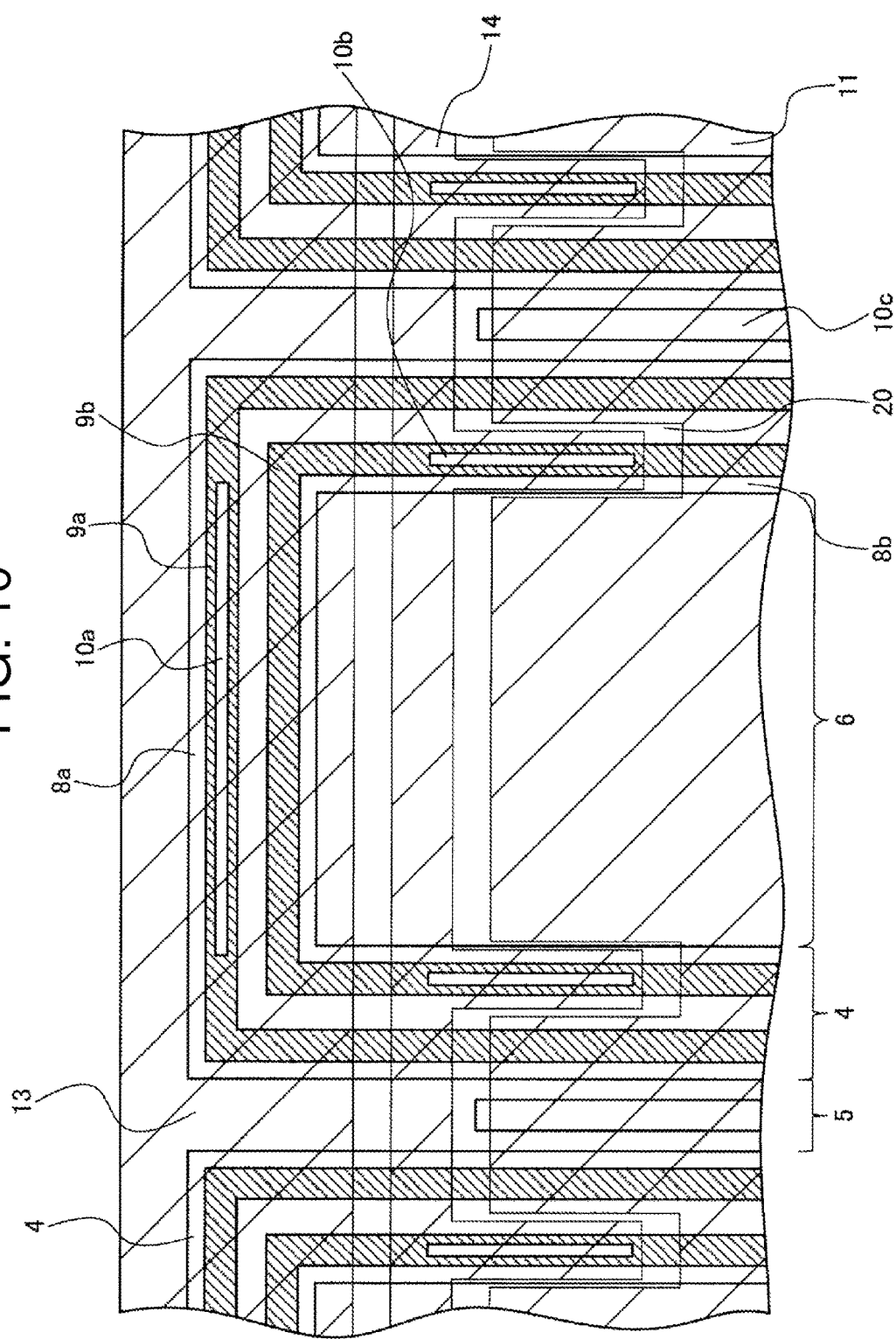
FIG. 10 is a plan view depicting a configuration of another example of the semiconductor device according to Embodiment 1.

Another example of the semiconductor device according to Embodiment 1 will now be described. FIG. 10 is a plan view depicting a configuration of another example of the semiconductor device according to Embodiment 1. In the example described above, the shield electrode 9b is electrically connected to the emitter electrode 11, but a fixed-potential electrode 14, which is disposed at a distance from the emitter electrode 11, may be formed as illustrated in FIG. 10. In this case, the shield electrode 9b is conductively connected to the fixed-potential electrode 14 via a contact plug embedded in the second contact hole 10b, and is insulated from the emitter electrode 11 by the inter-layer insulation film 10. The fixed-potential electrode 14 is connected to a fixed potential, such as a ground potential or a predetermined power supply potential. The fixed-potential electrode 14 can be formed in the same way as the emitter electrode 11. The fixed-potential electrode 14 may be connected to the emitter potential, and in this case, may be integrated with the emitter electrode 11.

In FIG. 10, the plane layout of the emitter electrode 11, the gate runner 13 and the fixed-potential electrode 14 are indicated by the hatching of wider diagonal lines than those indicating the first gate electrode 9a and the shield electrode 9b. For example, the emitter electrode 11 is disposed in an area from the p-base region 5 to the floating p-region 6, so as to cover the portion perpendicular to the direction in which the p-base region 5 and the floating p-region 6 are alternately disposed, out of the trench 4 which has a substantially rectangular shape, excluding the second contact hole 10b (hatched diagonal lines on the lower side of FIG. 10). The fixed-potential electrode 14 is disposed in an area from the p-base region 5 to the floating p-region 6, out of the rectangular trench 4 which has a substantially rectangular shape, so as to cover the portion that includes the second contact hole 10b (diagonal hatching in the mid-portion of FIG. 10). The gate runner 13 is disposed in the trench which has a substantially rectangular shape in the plan view, so as to cover the portion of the trench, with this portion being parallel with the direction in which the p-base region 5 and the floating p-region 6 are alternately disposed (diagonal hatching on the upper side of FIG. 10).

As described above, according to Embodiment 1, the first gate electrode and the shield electrode are disposed on both side walls of the trench via the first and second insulation films respectively, and each electrode is directly and conductively connected to each metal electrode (second gate electrode and fixed-potential electrode) respectively, whereby the polysilicon film that extends from the inner walls of the trench, to be the first gate electrode and the shield electrode, does not remain on the front surface of the silicon substrate. Therefore after the polysilicon film is formed from the front surface of the silicon substrate to the inner walls of the trench, the polysilicon film is etched back, and the polysilicon film to be the first gate electrode and the shield electrode remains only on the side walls of the trench by etching back the polysilicon film without using a resist mask. As a result, the first gate electrode and the shield electrode can be formed on both side walls of the trench respectively without performing conventional patterning steps on the polysilicon film by photolithography and etching. Since an increase the number of processes is minimal, the fabrication process can be shortened.

Moreover according to Embodiment 1, the first gate electrode and the shield electrode can be formed on both side walls of the trench respectively without performing patterning steps on the polysilicon film by using a resist mask, hence the generation of resist residue in the trenches can be prevented. This prevents a drop in the yield and reliability when fabricating the semiconductor device, which includes the first gate electrode and the shield electrode on both side walls of the trench respectively. Capacitance between the gate and the emitter can be reduced by conductively connecting the shield electrode on the floating p-region side to, for example, the fixed-potential electrode of the emitter potential to improve the turn ON characteristic, whereby a highly reliable semiconductor device with low switching loss can be fabricated with good yield.

(Embodiment 2)

Figure 11:
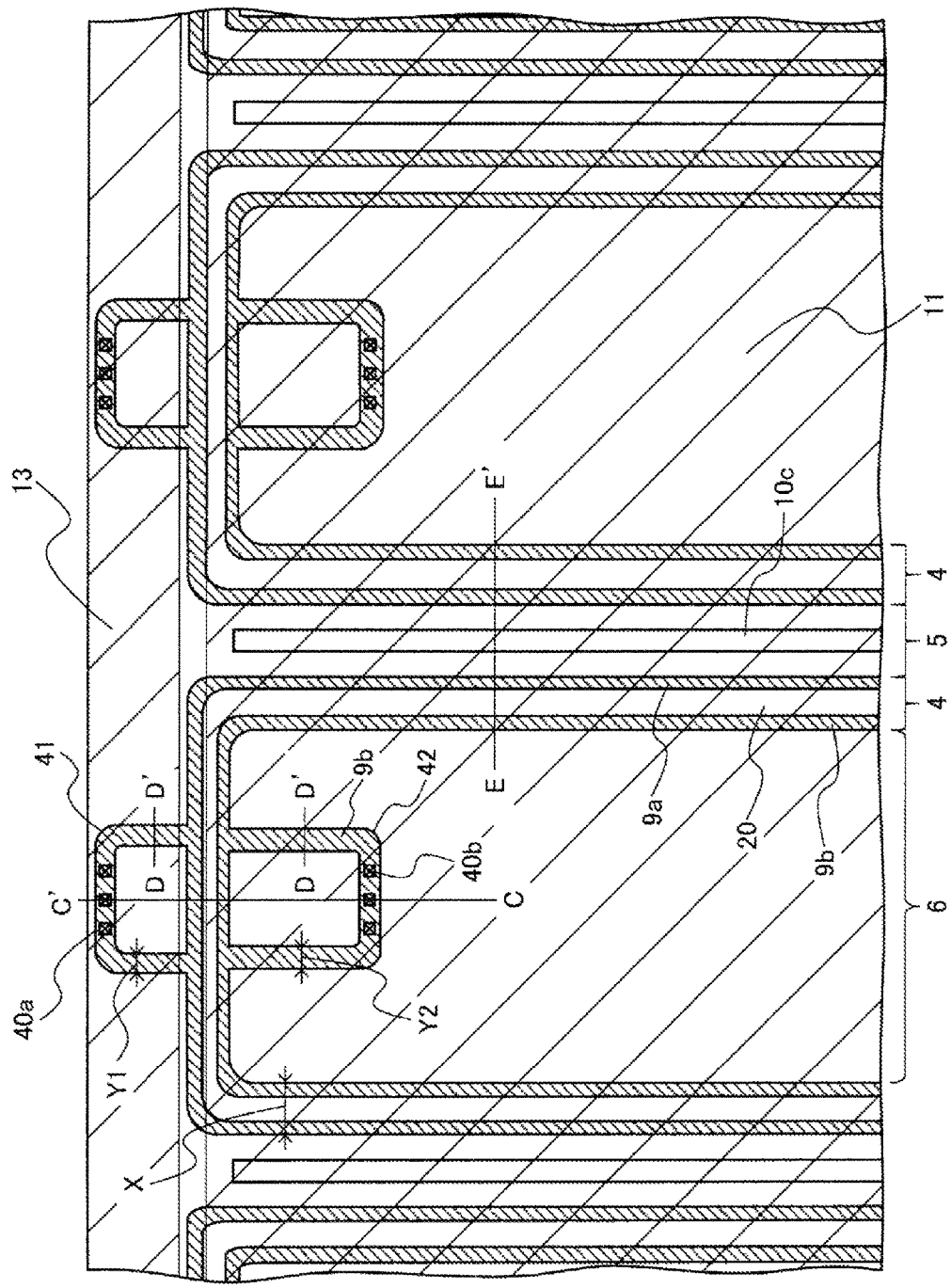
FIG. 11 is a plan view depicting a configuration of a semiconductor device according to Embodiment 2.
Figure 12:
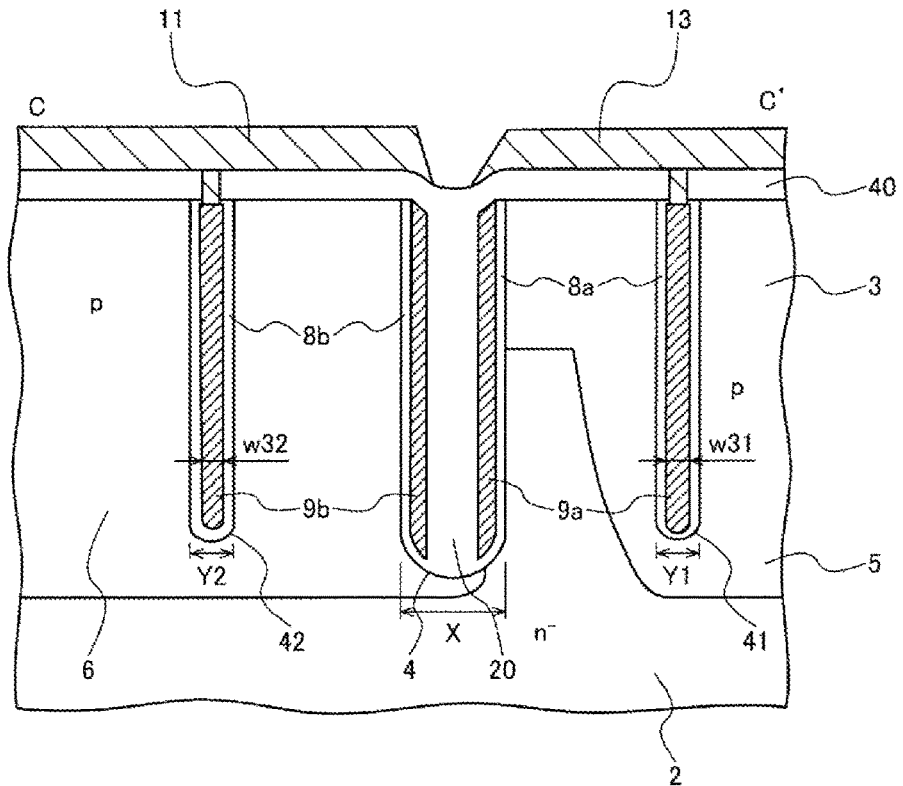
FIG. 12 is a cross-sectional view depicting a cross-sectional structure at the C-C' line in FIG. 11.
Figure 13:
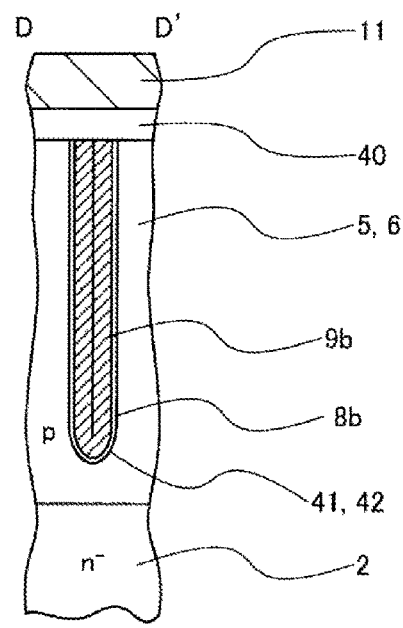
FIG. 13 is a cross-sectional view depicting a cross-sectional structure at the D-D' line in FIG. 11.
Figure 14:
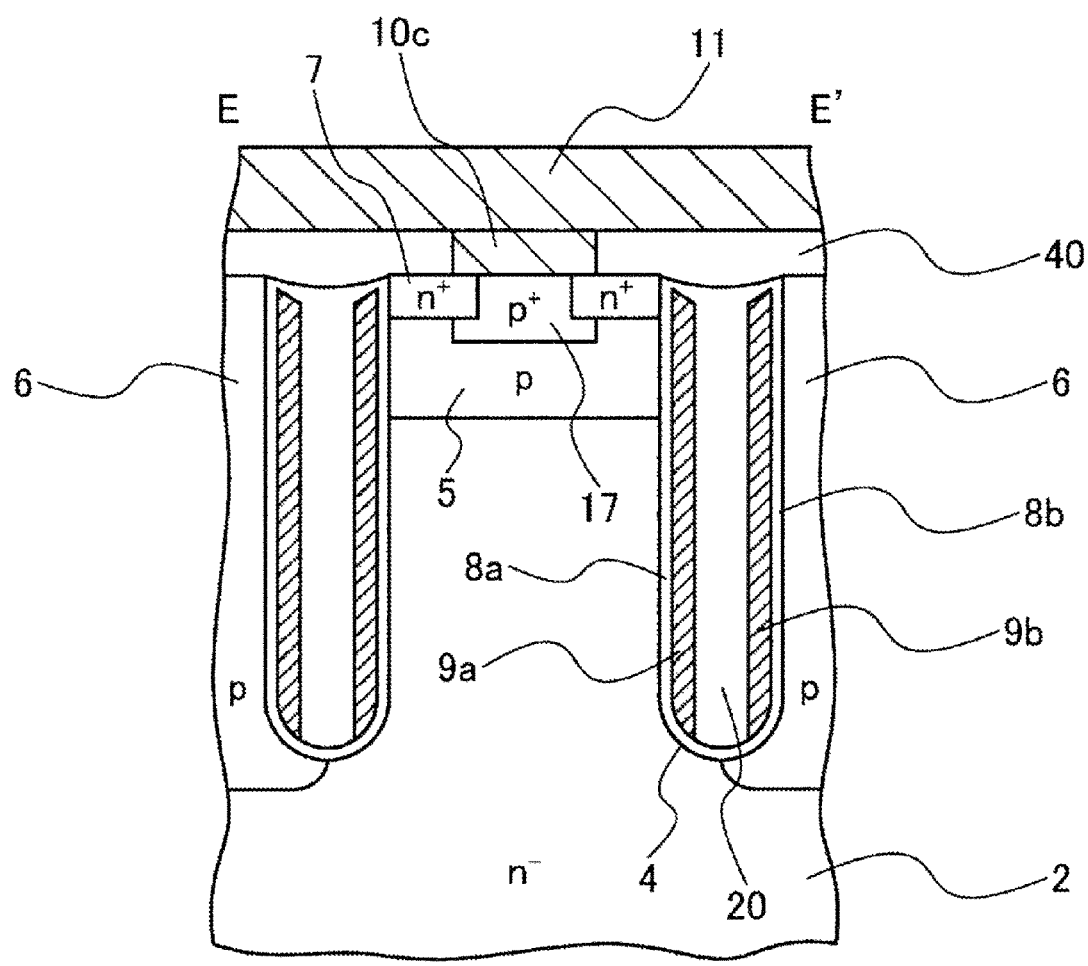
FIG. 14 is a cross-sectional view depicting a cross-sectional structure at the E-E' line in FIG. 11.

A configuration of a semiconductor device according to Embodiment 2 will be described next. FIG. 11 is a plan view depicting the configuration of the semiconductor device according to Embodiment 2. FIG. 12 is a cross-sectional view depicting a cross-sectional structure at the C-C' line in FIG. 11. FIG. 13 is a cross-sectional view depicting a cross-sectional structure at the D-D' line in FIG. 11. In FIG. 13, the reference numbers 5 and 6 and the reference numbers 41 and 42 indicate that the second trench 41 is disposed in the p-base region 5, and the third trench 42 is disposed in the floating p-region 6 (same for FIG. 18 to FIG. 26 described later). FIG. 14 is a cross-sectional view depicting a cross-sectional structure at the E-E' line in FIG. 11. In FIG. 11, an illustration of the insulation film that is disposed along the inner walls of each trench is omitted (same for FIG. 15 and FIG. 16).

The difference of the semiconductor device according to Embodiment 2 from the semiconductor device according to Embodiment 1 are the positions where the first and second contact holes 40a and 40b are disposed. In concrete terms, in addition to the rectangular frame-shaped trench (hereafter called the "first trench") 4, a second trench 41, in which the first gate electrode 9a is disposed via the first insulation film 8a, and the third trench 42, in which the shield electrode 9b is disposed via the second insulation film 8b, are disposed on the front surface of the silicon substrate. The second trench 41 is disposed in the p-base region 5 at a portion where the $n^+$ emitter region 7 and the $p^+$ contact region 17 do not exist. The p-base region 5 includes a region that is deeper than the depth of the first trench 4, in a region where the second trench 41 is formed. The depth of the second trench 41 is shallower than the depth of the region of the p-base region 5, of which depth is deeper than the depth of the first trench 4. By surrounding most of the bottom portion of the second trench 41 with the p-base region 5 like this, the concentration of the electric field in the bottom portion of the second trench 41 can be relaxed.

The second trench 41 is substantially U-shaped in the plan view, and both ends thereof are connected to the side wall on the outer side of the first trench 4. In other words, the second trench 41 and the first trench 4 together form a frame shape in the plan view. The shape of the second trench 41 is not limited to a U shape in the plan view, as long as both ends thereof are connected to the side wall on the outer side of the first trench 4, so as to form a frame shape with the first trench 4. The first insulation film 8a extends from the inner wall on the outer side of the first trench 4 to the inner wall of the second trench 41. The first gate electrode 9a is formed on the inner side of the first insulation film 8a from the first trench 4 to the second trench 41. The inner side of the first insulation film 8a inside the second trench 41 is embedded by the first gate electrode 9a.

The third trench 42 is disposed in the floating p-region 6 enclosed by the first trench 4 having a substantially rectangular frame shape. Unlike Embodiment 1, here the depth of the floating p-region 6 is deeper then the depth of the first trench 4. The depth of the third trench 42 is shallower than the depth of the floating p-region 6. By enclosing the bottom portion of the third trench 42 with the floating p-region 6 in this way, the concentration of the electric field in the bottom portion of the third trench 42 can be relaxed. The third trench 42 is substantially U-shaped in the plan view, and both ends thereof are connected to the side walls of the first trench 4 on the inner side. In other words, the third trench 42 and the first trench 4 form a frame shape in the plan view. The third trench 42 may be, for example, disposed symmetrically with the second trench 41 with respect to the first trench 4. The third trench 42 is not limited to a U shape in the plan view, as long as both ends of the third trench 42 are connected to the side walls on the inner side of the first trench 4, so as to form a frame shape with the first trench 4. The second insulation film 8b extends from the inner wall on the inner side of the first trench 4 to the inner wall of the third trench 42. The shield electrode 9b is disposed on the inner side of the second insulation film 8b from the first trench 4 to the third trench 42. The inner side of the second insulation film 8b in the third trench 42 is embedded by the shield electrode 9b.

The width Y1 and Y2 of the second and third trenches 41 and 42 are narrower than the width X of the first trench 4 (Y1<X, Y2<X). The width w31 of the first gate electrode 9a disposed inside the second trench 41 is wider than the width w11 of the first gate electrode 9a disposed inside the first trench 4 (w31>w11). The width w32 of the shield electrode 9b disposed inside the third trench 42 is wider than the width w12 of the shield electrode 9b disposed inside the first trench 4 (w32>w12). The emitter electrode 11 faces the first and third trenches 4 and 42 via the inter-layer insulation film 40. The gate runner 13 faces the second trench 41 via the inter-layer insulation film 40.

The first contact hole 40a selectively exposes the first gate electrode 9a disposed inside the second trench 41. In other words, the first gate electrode 9a disposed inside the second trench 41 is conductively connected to the gate runner 13 via the first contact hole 40a. The second contact hole 40b selectively exposes the shield electrode 9b disposed inside the third trench 42. In other words, the shield electrode 9b disposed inside the third trench 42 is conductively connected to the emitter electrode 11 via the second contact hole 40b. If the fixed-potential electrode 14 is disposed, the shield electrode 9b disposed inside the third trench 42 is conductively connected to the fixed-potential electrode 14 via the second contact hole 40b. Each of the first and second contact holes 40a and 40b may be constituted by a plurality of contact holes each of which has a substantially square shape in the plan view, or may be constituted by one contact hole having a substantially rectangular shape in the plan view along the side walls of the trench.

As described above, according to Embodiment 2, an effect similar to Embodiment 1 can be obtained. Further, according to Embodiment 2, the contact holes are formed in the inter-layer insulation film on the second and third trenches embedding the gate electrodes, thereby the widths of the contact holes can be wider than the case of forming the contact holes in the inter-layer insulation film on the gate electrodes disposed along both side walls of the first trench respectively. As a result, a drop in the withstand voltage of the gate and reliability of the gate characteristics, due to forming the contact holes near the edge of the first trench, can be prevented.

(Embodiment 3)

Figure 15:
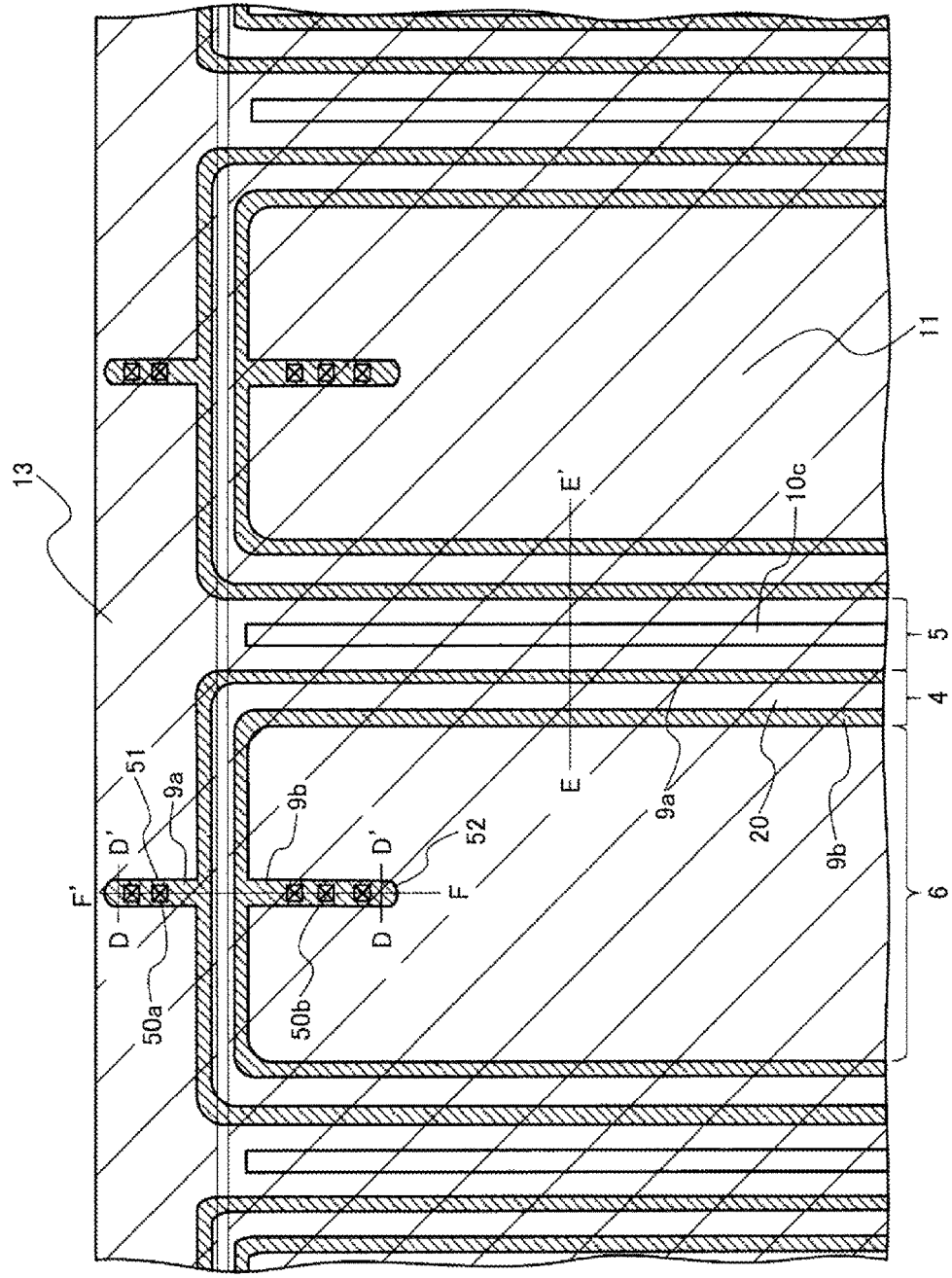
FIG. 15 is a plan view depicting a configuration of a semiconductor device according to Embodiment 3.
Figure 16:
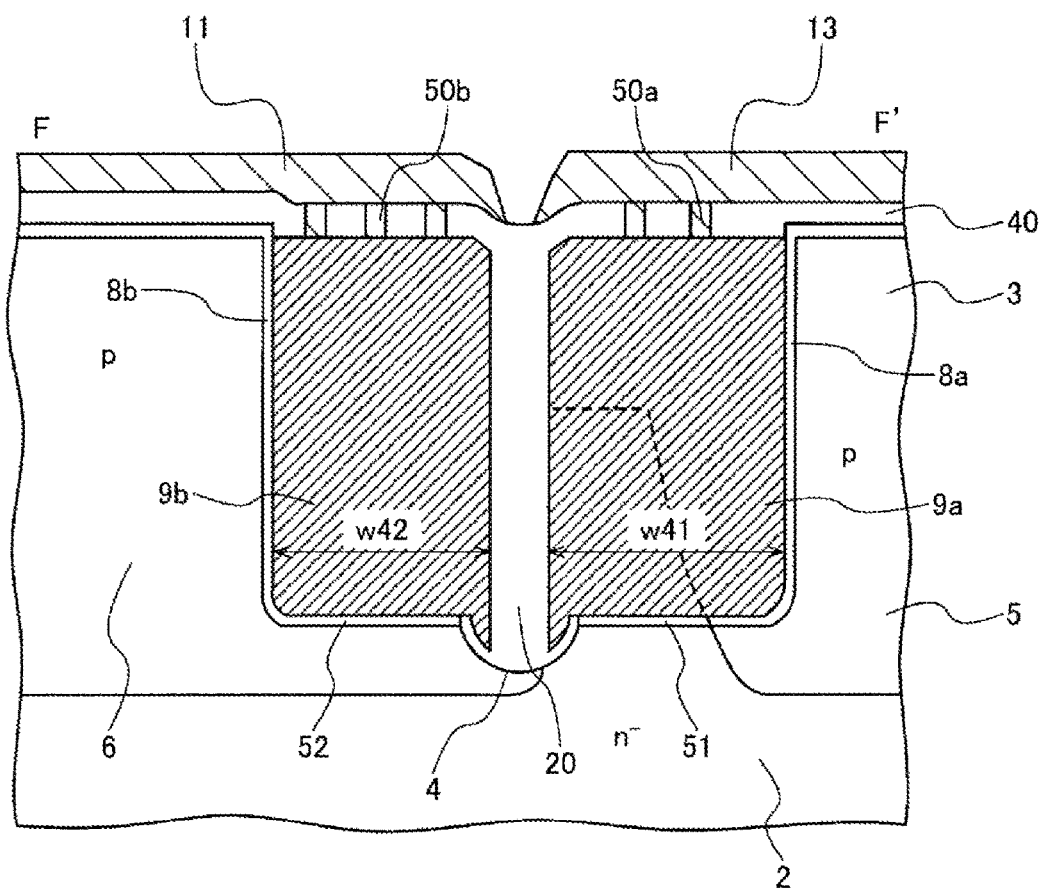
FIG. 16 is a cross-sectional view depicting a cross-sectional structure at the F-F' line in FIG. 15.

A configuration of a semiconductor device according to Embodiment 3 will be described next. FIG. 15 is a plan view depicting the configuration of the semiconductor device according to Embodiment 3. FIG. 16 is a cross-sectional view depicting a cross-sectional structure at the F-F' line in FIG. 15. The cross-sectional structure at the D-D' line in FIG. 15 is the same as FIG. 13. The cross-sectional structure at the E-E' line in FIG. 15 is the same as FIG. 14. The difference of the semiconductor device according to Embodiment 3 from the semiconductor device according to Embodiment 2 is that the second and third trenches 51 and 52 having linear shapes in the plan view are disposed.

The second and third trenches 51 and 52 have a linear shape in the plan view, and one pair of ends thereof is connected to the first trench 4. The other pair of ends (opposite end from the end connected to the first trench 4) may have an arc shape in the plan view, as illustrated, or may have a rectangular shape. The second and third trenches 51 and 52 are disposed on the same line crossing the first trench 4 so as to be symmetrical with respect to the first trench 4. In other words, the width w41 of the first gate electrode 9a and the width w42 of the shield electrode 9b, in the portions where the second and third trenches 51 and 52 are disposed, are wider than the width w11 of the first gate electrode 9a and the width w12 of the shield electrode 9b in the other portions. For the first and second contact holes 50a and 50b, a plurality of square-shaped contact holes may be disposed at predetermined intervals, or one long rectangular contact hole may be disposed in a direction along the trench side walls.

As described above, according to Embodiment 3, an effect similar to Embodiments 1 and 2 can be obtained.

(Embodiment 4)

A configuration of a semiconductor device according to Embodiment 4 will be described. FIGS. 17A and 17B are plan views depicting a configuration of the semiconductor device according to Embodiment 4. The semiconductor device according to Embodiment 4 is another example of the semiconductor device according to Embodiment 3. As illustrated in FIG. 17A, a plurality of the second and third trenches 51 and 52 may be disposed respectively. In this case, the second and third trenches 51 and 52 are disposed to have a combed-teeth shape, for example. The second trench 51 and the third trench 52 need not be disposed on the same line crossing the first trench 4. In concrete terms, for example, the portion of the p-base region 5 between adjacent second trenches 51 may face the third trench 52 via the first trench 4. The shape of the end of each of the second and third trenches 51 and 52 located at the opposite side of the ends connected to the first trench 4, may be different from each other, as illustrated in FIG. 17A, or it may have the same shape.

As illustrated in FIG. 17B, the widths of the second and third trenches 61 and 62 may be wider than Embodiment 2 or Embodiment 3. In concrete terms, the second trench 61 is not embedded by the first gate electrode 9a, but the insulation film 20 is embedded between the first gate electrodes 9a. The first contact hole 60a is disposed on the pairing side portions of the second trench 61 and the insulation film 20 between these two pairing side portions. The width Y3 of the second trench 61 in the direction of crossing the pairing side portions of the second trench 61 is preferably the width X of the first trench 4 or less, since it is preferable to embed the insulation film 20 in the second trench 61 within the time required to embed the insulation film 20 in the first trench 4. In the same manner, the third trench 62 is not embedded by the shield electrode 9b, but the insulation film 20 is embedded between the shield electrodes 9b. Then a second contact hole 60b is disposed on the pairing side portions of the third trench 62 and the insulation film 20 between these two pairing side portions. The width Y4 of the third trench 62 in the direction of crossing the pairing side portions of the third trench 62 is preferably the width X of the first trench 4 or less, since it is preferable to embed the insulation film 20 in the third trench 62 within the time required to embed the insulation film 20 in the first trench 4.

As described above, according to Embodiment 4, an effect similar to Embodiments 1 to 3 can be obtained.

(Embodiment 5)

A method for fabricating the semiconductor device according to Embodiment 5 will now be described. FIGS. 18A to 26B are cross-sectional views depicting the states upon fabricating the semiconductor device according to Embodiment 5. The method for fabricating the semiconductor device according to Embodiment 5 is also a method for fabricating the semiconductor devices according to Embodiments 2 to 4. Here a case of fabricating a semiconductor device according to Embodiment 2 will be described as an example. In FIGS. 18A to 26B, A is a cross-sectional view depicting a state upon fabricating at the E-E' line in FIG. 14, and B is a cross-sectional view depicting a state upon fabricating at the D-D' line in FIG. 13.

Figure 18A:
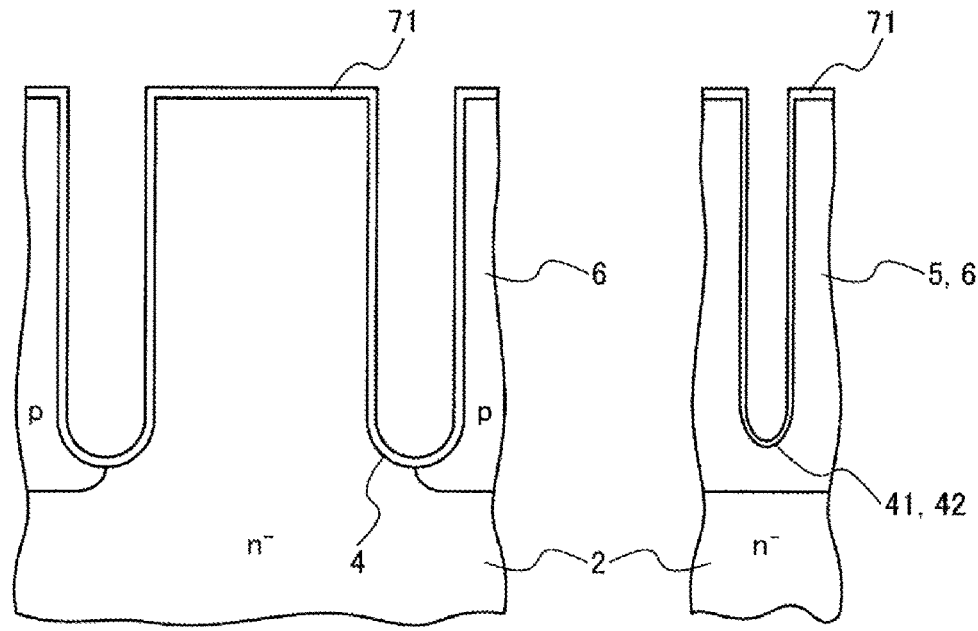
FIGS. 18A and 18B are cross-sectional views depicting a state upon fabricating the semiconductor device according to Embodiment 5.
Figure 18B:
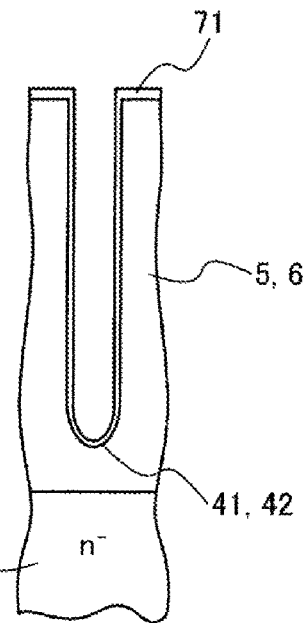

First as illustrated in FIGS. 18A and 18B, a silicon substrate, in which the n⁻ drift layer 2 is stacked on the front surface of the p⁺ semiconductor substrate to be the p⁺ collector region (not illustrated), is provided. Then a mask (not illustrated) is formed on the surface of the silicon substrate by photolithography, and ion implantation is performed to form the deep region of the p-base region 5 and the floating p-region 6. Then the first to third trenches 4, 41 and 42 are formed from the front surface side of the silicon substrate at a depth that does not reach the p⁺ collector region. At this time, the widths Y1 and Y2 of the second and third trenches 41 and 42 are made to be narrower than the width X of the first trench 4.

Figure 19A:
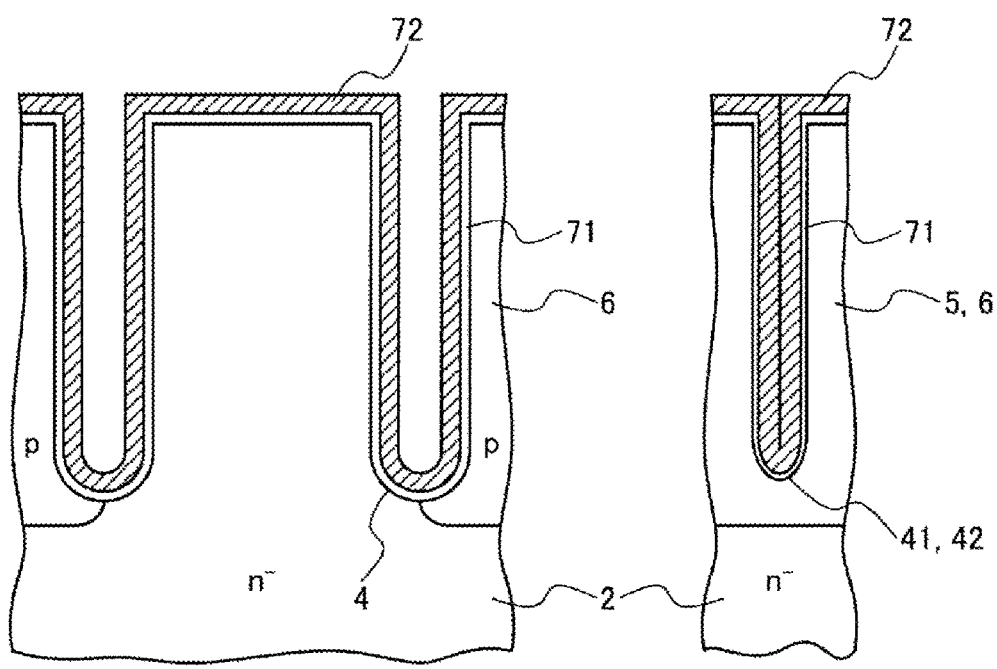
FIGS. 19A and 19B are cross-sectional views depicting a state upon fabricating the semiconductor device according to Embodiment 5.
Figure 19B:
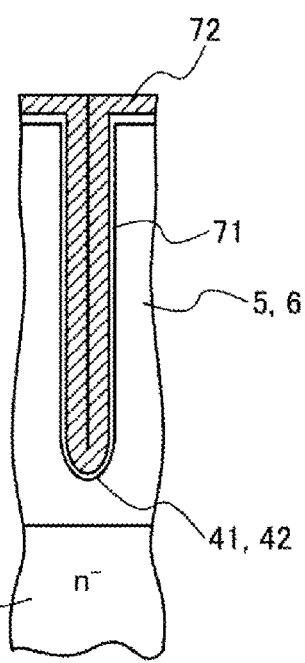

Then the deep region of the p-base region 5 and the floating p-region 6 are formed by heat treatment. It is preferable to perform this heat treatment before the ion implementation to form the shallow region of the p-base region 5, which is described later. Then an insulation film 71 is formed inside the first to third trenches 4, 41 and 42 along the inner walls of the first to third trenches 4, 41 and 42. Then as illustrated in FIGS. 19A and 19B, a polysilicon film 72 as the conductor layer is formed on the inner side of the insulation film 71 along the inner walls of the first to third trenches 4, 41 and 42.

The polysilicon film 72 is formed such that the inner side of the insulation film 71 is not embedded by the polysilicon film 72 in the first trench 4, and the inner side of the insulation film 71 is embedded by the polysilicon film 72 in the second and third trenches 41 and 42. As mentioned above, the widths Y1 and Y2 of the second and third trenches 41 and 42 are narrower than the width X of the first trench 4. Therefore even if the entire inner side of the insulation film 71 is embedded by the polysilicon film 72 in the second and third trenches 41 and 42, the inner side of the insulation film 71 is not embedded by the polysilicon film 72 in the first trench 4.

As illustrated in FIGS. 20A and 20B, the polysilicon film 72 is etched back by anisotropic etching, so that the polysilicon film 72 is removed from the front surface of the silicon substrate (surface of the n⁻ drift layer 2) and the bottom surface of the first trench 4, and the polysilicon film 72 remains on the side walls of the first trench 4. At this time, the polysilicon film 72 embedded in the inner side of the insulation film 71 of the second and third trenches 41 and 42 remains in a state substantially the same as the state before the etch back process. The polysilicon films 72 that remain on the side walls of the first trench 4 are the first gate electrode 9a and the shield electrode 9b. The polysilicon film 72 that remains in the second trench 41 is the first gate electrode 9a. The polysilicon film 72 that remains in the third trench 42 is the shield electrode 9b.

Figure 22A:
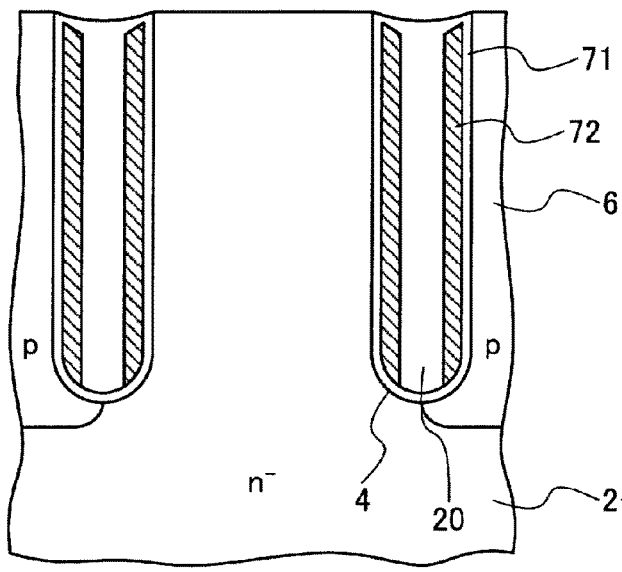
FIGS. 22A and 22B are cross-sectional views depicting a state upon fabricating the semiconductor device according to Embodiment 5.
Figure 22B:
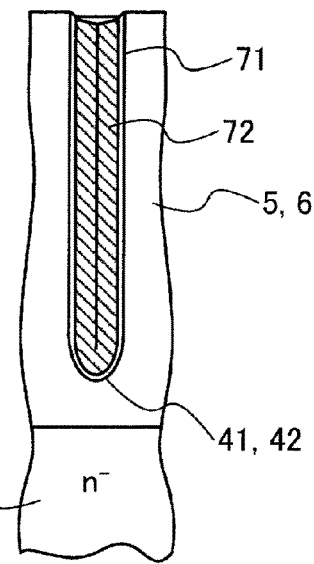

Then as illustrated in FIGS. 21A and 21B, the insulation film 20 is formed so as to embed the inner side of the polysilicon film 72 in the first trench 4, just like Embodiment 1, and then as illustrated in FIGS. 22A and 22B, the insulation films 20 and 71 are etched back. Thereby the insulation film 20 remains on the inner side of the polysilicon film 72 in the first trench 4, and the insulation film 71 remains on the inner walls of the first to third trenches 4, 41 and 42. These insulation films 71 that remain on the inner walls of the first trench 4 are the first and second insulation films 8a and 8b. The insulation film 71 that remains on the inner wall of the second trench 41 is the first insulation film 8a. The insulation film 71 that remains on the inner wall of the third trench 42 is the second insulation film 8b.

Figure 23A:
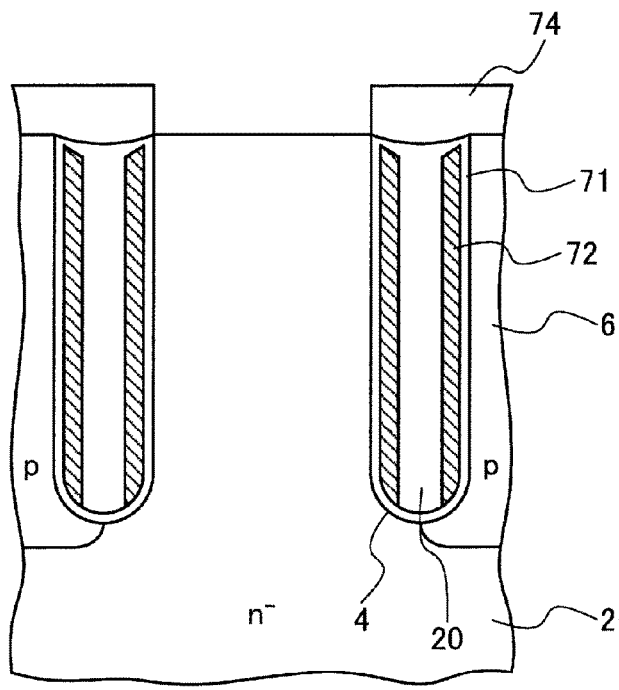
FIGS. 23A and 23B are cross-sectional views depicting a state upon fabricating the semiconductor device according to Embodiment 5.
Figure 23B:
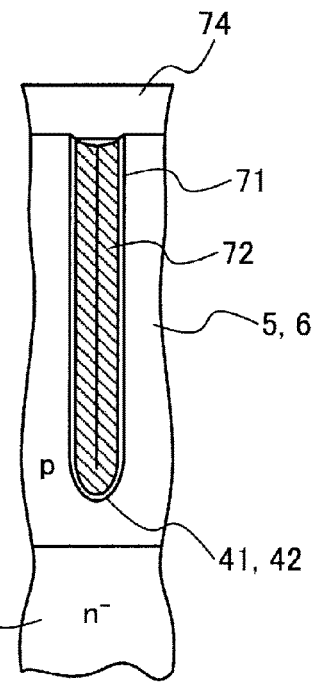
Figure 24A:
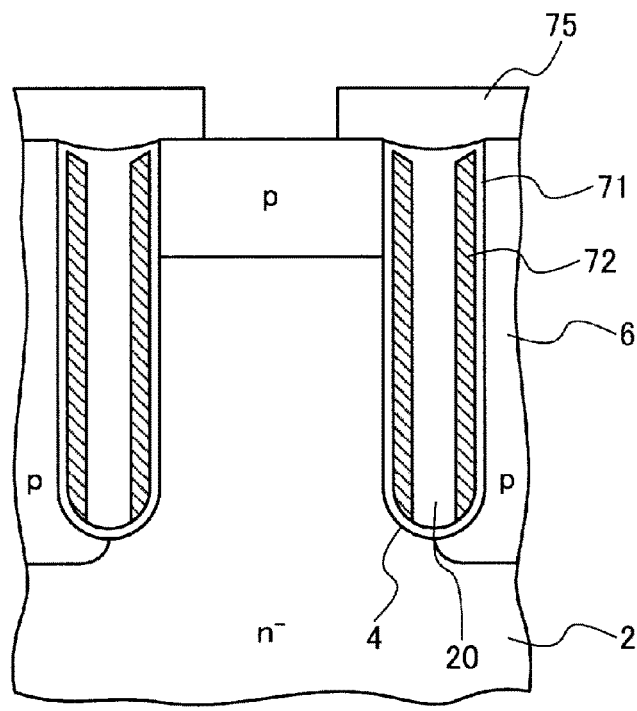
FIGS. 24A and 24B are cross-sectional views depicting a state upon fabricating the semiconductor device according to Embodiment 5.
Figure 24B:
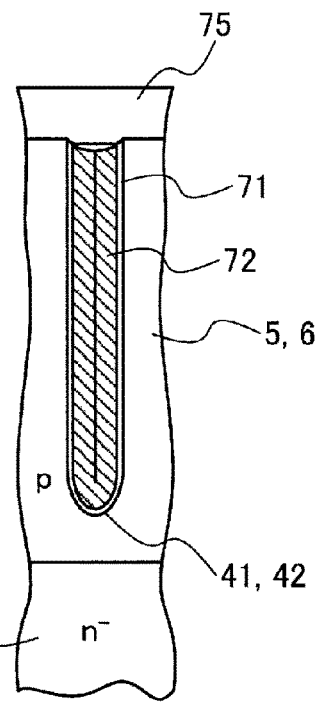

Then as illustrated in FIGS. 23A and 23B, a resist mask 74 having openings in portions corresponding to the region of the p-base region 5 in a portion where the MOS gate structure is formed (that is, the portion outside the first trench 4, sandwiched by two adjacent first trenches 4) is formed on the front surface of the silicon substrate. Then as illustrated in FIGS. 24A and 24B, p-type impurities, such as boron, are ion-implanted using the resist mask 74 as a mask, and the p-base region 5 is formed on the surface layer of the n drift layer 2 in a portion that is outside the first trench 4, sandwiched by the adjacent first trenches 4, at a depth that is deeper than the depth of the first trench 4. Thereby the p-base region 5 and the floating p-region 6, separated by a plurality of first trenches 4, are formed. Then the resist mask 74 is removed.

Figure 25A:
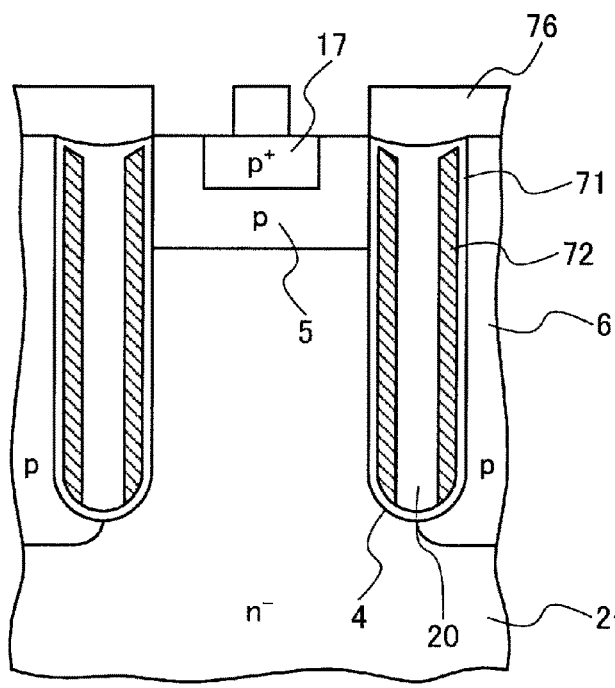
FIGS. 25A and 25B are cross-sectional views depicting a state upon fabricating the semiconductor device according to Embodiment 5.
Figure 25B:
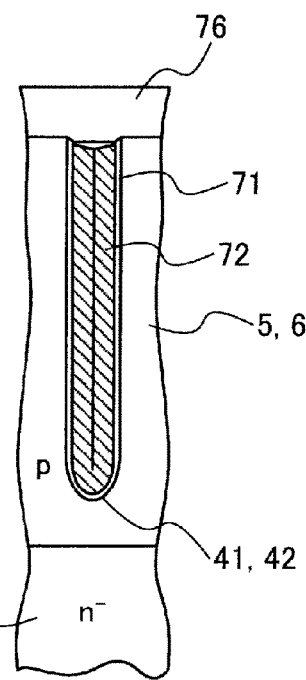
Figures 26A, 26B:
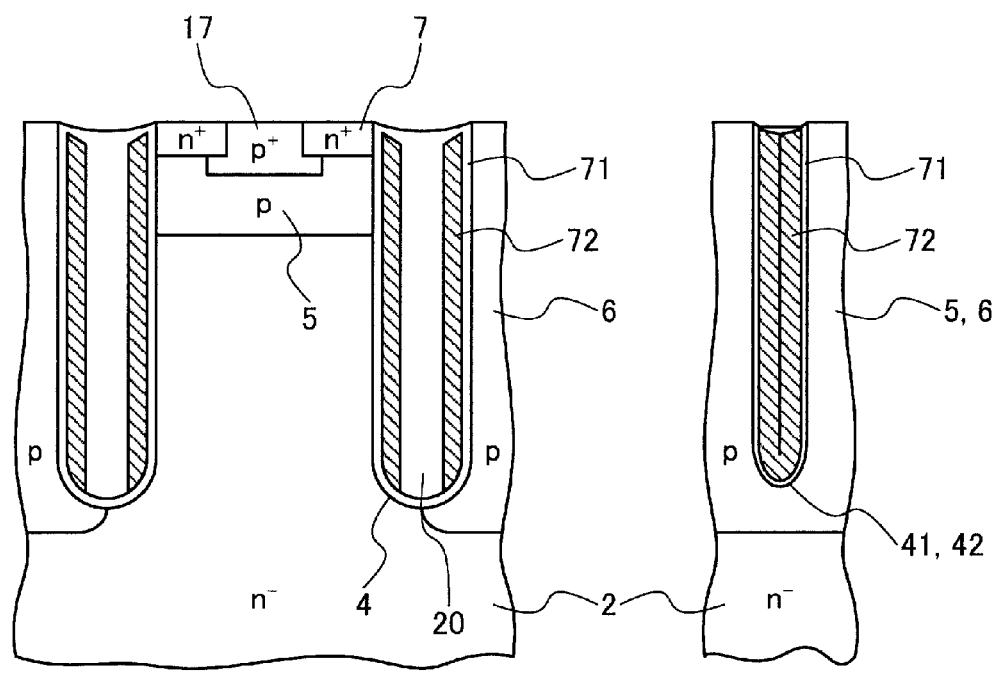
FIGS. 26A and 26B are cross-sectional views depicting a state upon fabricating the semiconductor device according to Embodiment 5.
Figure 27:
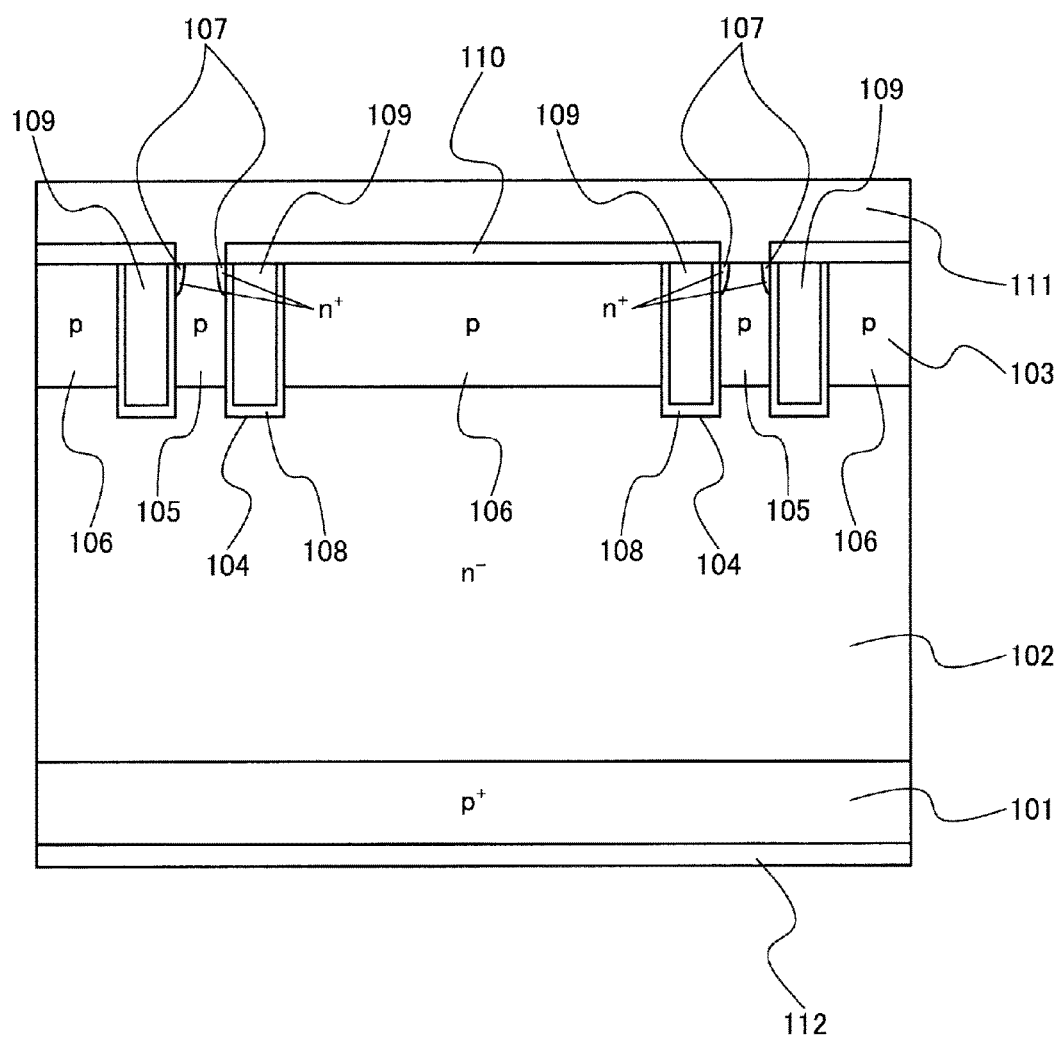
FIG. 27 is a cross-sectional view depicting a configuration of a typical trench gate type IGBT.

Then a resist mask 75 having openings in portions corresponding to the region where the p+ contact region 17 is formed on the front surface of the silicon substrate. Then the p-type impurities, such as boron, are ion-implanted using the resist mask 75 as a mask, and, as shown in FIGS. 25A and 25B, the p+ contact region 17 is formed on the surface layer of the p-base region 5 in a portion that is outside the first trench 4, sandwiched by adjacent first trenches 4. Then the resist mask 75 is removed. Then a resist mask 76 having openings in portions corresponding to the region of the n+ emitter region 7 is formed on the front surface of the silicon substrate. Then n-type impurities, such as phosphorus, are ion-implanted using the resist mask 76 as a mask. Thereby as illustrated in FIGS. 26A and 26B, the n+ emitter region 7, contacting the p+ contact region 17, is formed on the surface layer of the p-base region 5. Then the resist mask 76 is removed. The sequence of forming the n+ emitter region 7 and the p+ contact region 17 may be reversed.

Then the inter-layer insulation film 40 is formed on the entire front surface of the silicon substrate. Then the inter-layer insulation film 40 in the portions corresponding to the first, second and third contact holes 40a, 40b and 10c is removed by photolithography and etching. Thereby the polysilicon film 72 to be the first gate electrode 9a formed inside the second trench 41 is selectively exposed in the first contact hole 40a. The polysilicon film 72 to be the shield electrode 9b formed inside the third trench 42 is selectively exposed in the second contact hole 40b. Further, the n+ emitter region 7 and the p+ contact region 17 are selectively exposed in the third contact hole 10c. Then, for example, the barrier metal film, constituted by titanium film or titanium nitride film, is formed inside the first, second and third contact holes 40a, 40b and 10c.

Then the tungsten film is formed so as to be embedded inside the first, second and third contact holes 40a, 40b and 10c. Then the tungsten film is etched back, so as to remove the tungsten film on the surface of the inter-layer insulation film 40. Then the aluminum silicon electrode, for example, to be the emitter electrode 11 and the gate runner 13, is formed on the inter-layer insulation film 40. Thereby the polysilicon film 72 to be the first gate electrode 9a is conductively connected to the gate runner 13 via the barrier metal film and the tungsten film. The polysilicon film 72 to be the shield electrode 9b is conductively connected to the emitter electrode 11 via the barrier metal film and the tungsten film. Then the passivation film is formed on the surface of the silicon substrate, and the passivation film is selectively opened so that the gate pad 81 and the emitter electrode 11 are partially exposed. The exposed emitter electrode 11 becomes the emitter pad. Then the collector electrode 12 is formed on the rear surface of the silicon substrate, whereby the semiconductor device illustrated in FIGS. 11 to 14 is completed.

As described above, according to Embodiment 5, an effect similar to Embodiments 1 to 4 can be obtained.

In the present invention described above, IGBT is used as an example, but the present invention is not limited to the embodiments described above, but can be applied to semiconductor devices that have various configurations including an MOS gate structure. In each embodiment, the first conductive type is an n-type, and the second conductive type is a p-type, but the present invention can be applied just the same when the first conductive type is a p-type and the second conductive type is an n-type.

INDUSTRIAL APPLICABILITY

As described above, the semiconductor device and the method for fabricating the semiconductor device according to the present invention is useful for the power semiconductor devices that are used for power converters and the like.

EXPLANATION OF REFERENCE NUMERALS 1 p+ collector region
2 n− drift layer
3 p-layer
4 trench (first trench)
5 p-base region
6 floating p-region
7 n+ emitter region
8a first insulation film
8b second insulation film
9a first gate electrode
9b shield electrode
10, 40 inter-layer insulation film
10a, 40a, 50a, 60a first contact hole
10b, 40b, 50b, 60b second contact hole
10c third contact hole
11 emitter electrode
12 collector electrode
13 gate runner (second gate electrode)
14 fixed-potential electrode
17 p+ contact region
20 insulation film
41, 51, 61 second trench
42, 52, 62 third trench
80-1 active region
80-2 edge-termination region
81 gate pad

What is claimed is:
1. A semiconductor device, having a trench structure that includes:
  a first trench that is formed in a surface layer of a first conductive type semiconductor layer;
  a second conductive type base region that is selectively formed on the surface layer of the first conductive type semiconductor layer at a depth shallower than the first trench, along one side wall of the first trench;
  an emitter region that is formed on a surface layer of the base region so as to contact the one side wall of the first trench; and
  a second conductive type floating potential region that is selectively formed on the surface layer of the first conductive type semiconductor layer along the other side wall of the first trench,
  the semiconductor device comprising:
  a first insulation film that is disposed along the one side wall of the first trench;
  a second insulation film that is disposed along the other side wall of the first trench;
  a first gate electrode that is disposed inside the first insulation film along the one side wall of the first trench;
  a shield electrode that is disposed inside the second insulation film along the other side wall of the first trench;
  a third insulation film that is embedded in the first trench between the first gate electrode and the shield electrode;

an inter-layer insulation film that covers the first gate electrode, the shield electrode and the emitter region;
a second gate electrode that is disposed on the inter-layer insulation film;
an emitter electrode that is disposed on the inter-layer insulation film at a distance from the second gate electrode;
a fixed-potential electrode that is disposed on the inter-layer insulation film at a distance from the second gate electrode;
a first contact hole that is selectively disposed on the inter-layer insulation film in a portion between the second gate electrode and the first gate electrode, and in which a first contact plug for conductively connecting the second gate electrode and the first gate electrode is embedded;
a second contact hole that is selectively disposed on the inter-layer insulation film in a portion between the fixed-potential electrode and the shield electrode, and in which a second contact plug for conductively connecting the fixed-potential electrode and the shield electrode is embedded; and
a third contact hole that is selectively disposed on the inter-layer insulation film in a portion between the emitter electrode and the emitter region, and in which a third contact plug for conductively connecting the emitter electrode and the emitter region is embedded;
wherein the first trench has an annular planar shape, and the first gate electrode and the shield electrode have a planar shape such that the first gate electrode surrounds the shield electrode.

2. The semiconductor device according to claim 1, wherein
the fixed-potential electrode is integrated with the emitter electrode.

3. A semiconductor device, having a trench structure that includes:
a first trench that is formed in a surface layer of a first conductive type semiconductor layer;
a second conductive type base region that is selectively formed on the surface layer of the first conductive type semiconductor layer at a depth shallower than the first trench, along one side wall of the first trench;
an emitter region that is formed on a surface layer of the base region so as to contact the one side wall of the first trench; and
a second conductive type floating potential region that is selectively formed on the surface layer of the first conductive type semiconductor layer along the other side wall of the first trench,
the semiconductor device comprising:
a first insulation film that is disposed along the one side wall of the first trench;
a second insulation film that is disposed along the other side wall of the first trench;
a first gate electrode that is disposed inside the first insulation film along the one side wall of the first trench;
a shield electrode that is disposed inside the second insulation film along the other side wall of the first trench;
a third insulation film that is embedded in the first trench between the first gate electrode and the shield electrode;

an inter-layer insulation film that covers the first gate electrode, the shield electrode and the emitter region;
a second gate electrode that is disposed on the inter-layer insulation film;
an emitter electrode that is disposed on the inter-layer insulation film at a distance from the second gate electrode;
a fixed-potential electrode that is disposed on the inter-layer insulation film at a distance from the second gate electrode;
a first contact hole that is selectively disposed on the inter-layer insulation film in a portion between the second gate electrode and the first gate electrode, and in which a first contact plug for conductively connecting the second gate electrode and the first gate electrode is embedded;
a second contact hole that is selectively disposed on the inter-layer insulation film in a portion between the fixed-potential electrode and the shield electrode, and in which a second contact plug for conductively connecting the fixed-potential electrode and the shield electrode is embedded;
a third contact hole that is selectively disposed on the inter-layer insulation film in a portion between the emitter electrode and the emitter region, and in which a third contact plug for conductively connecting the emitter electrode and the emitter region is embedded;
a second trench that is connected to the one side wall of the first trench; and
a third trench that is connected to the other side wall of the first trench, wherein
the first insulation film is further disposed inside the second trench along the inner wall of the second trench;
the second insulation film is further disposed inside the third trench along the inner wall of the third trench;
the first gate electrode is further disposed on an inner side of the first insulation film inside the second trench,
the shield electrode is further disposed on an inner side of the second insulation film inside the third trench;
the second gate electrode is conductively connected via the first contact plug to the first gate electrode disposed inside the second trench; and
the fixed-potential electrode is conductively connected via the second contact plug to the shield electrode disposed inside the third trench.

4. The semiconductor device according to claim 3, wherein
a width of the second trench is narrower than a width of the first trench.

5. The semiconductor device according to claim 3, wherein
a width of the third trench is narrower than a width of the first trench.

6. The semiconductor device according to claim 3, wherein
one end and another end of each of the second trench and the third trench are connected to the first trench.

7. The semiconductor device according to claim 3, wherein
the second trench is disposed at a distance from the emitter region.

8. The semiconductor device according to claim 3, wherein
the third trench is disposed in the floating potential region.

* * * * *